United States Patent
Takahara

(10) Patent No.: US 11,339,008 B2
(45) Date of Patent: May 24, 2022

(54) TRANSPORT SYSTEM, TRANSPORT CONTROLLER, AND TRANSPORT VEHICLE CONTROL METHOD

(71) Applicant: MURATA MACHINERY, LTD., Kyoto (JP)

(72) Inventor: Masayuki Takahara, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 17/041,503

(22) PCT Filed: Feb. 4, 2019

(86) PCT No.: PCT/JP2019/003838
§ 371 (c)(1),
(2) Date: Sep. 25, 2020

(87) PCT Pub. No.: WO2019/187631
PCT Pub. Date: Oct. 3, 2019

(65) Prior Publication Data
US 2021/0047134 A1 Feb. 18, 2021

(30) Foreign Application Priority Data

Mar. 27, 2018 (JP) .............................. JP2018-059595

(51) Int. Cl.
*B65G 47/51* (2006.01)
*H01L 21/677* (2006.01)
(52) U.S. Cl.
CPC .... *B65G 47/5104* (2013.01); *H01L 21/67706* (2013.01); *H01L 21/67724* (2013.01)
(58) Field of Classification Search
CPC .......... B65G 47/5104; H01L 21/67706; H01L 21/67724
See application file for complete search history.

(56) References Cited

U.S. PATENT DOCUMENTS

2006/0051192 A1   3/2006 Fujiki
2015/0049322 A1*  2/2015 Park .................. H01L 21/67276
                                                       355/72
(Continued)

FOREIGN PATENT DOCUMENTS

EP    2 404 846 A1    1/2012
JP    2001-100841 A   4/2001
(Continued)

OTHER PUBLICATIONS

Official Communication issued in corresponding Chinese Patent Application No. 201980021978.7, dated Jun. 3, 2021.
(Continued)

*Primary Examiner* — Glenn F Myers
(74) *Attorney, Agent, or Firm* — Keating & Bennett, LLP

(57) ABSTRACT

A transport system includes a transport vehicle that transports an article, and a transport controller that controls the transport vehicle based on a host transport instruction received from a host controller. The transport controller includes a transport instructor which, in accordance with a host transport instruction, provides the transport vehicle with a transport instruction to transport an article at a pickup point to an unloading point, an overwriting processor which, in accordance with a host cancellation instruction to cancel the host transport instruction received from the host controller, overwrites the transport instruction provided to the transport vehicle with a move instruction which instructs to travel to a predetermined position and not to unload at the predetermined position, and provides the overwritten instruction to the transport vehicle, and a completion reporter which, upon the overwriting processor completing the overwriting, transmits to the host controller a cancellation completion report indicating the completion of the host cancellation instruction.

7 Claims, 11 Drawing Sheets

(56) References Cited

U.S. PATENT DOCUMENTS

2015/0329298 A1* 11/2015 Ito .................... H01L 21/67733
                                                              414/222.07
2016/0111309 A1*  4/2016 Lill .................. H01L 21/67766
                                                              414/217

FOREIGN PATENT DOCUMENTS

JP          2001-296922 A    10/2001
JP             4462199 B2     5/2010

OTHER PUBLICATIONS

Official Communication issued in International Patent Application No. PCT/JP2019/003838, dated Apr. 2, 2019.
Official Communication issued in corresponding European Patent Application No. 19775921.0, dated Dec. 17, 2021.

* cited by examiner

TRANSPORT SYSTEM, TRANSPORT CONTROLLER, AND TRANSPORT VEHICLE CONTROL METHOD

BACKGROUND OF THE INVENTION

1. Field of the Invention

The present invention relates to a transport system, a transport controller, and a transport vehicle control method.

2. Description of the Related Art

In a semiconductor device manufacturing factory or the like, articles accommodating, for example, semiconductor wafers or reticles are transported by a transport system. A transport system includes, for example, a host controller which controls load transport, a plurality of transport vehicles which travel on tracks, and a transport controller which controls the plurality of transport vehicles. The host controller transmits a host transport instruction related to load transport to the transport controller. Each of the plurality of transport vehicles transmits information, for example, its current position, to the transport controller by, for example, wireless communication. Upon receiving the host transport instruction from the host controller, the transport controller determines a transport vehicle to execute the host transport instruction on the basis of the position of the transport vehicle and so forth, and assigns the transport vehicle with a transport instruction on the basis of the host transport instruction.

In the above transport system, when the transport vehicle is traveling toward a transport origin or is transporting a load to a transport destination on the basis of the transport instruction, the transport destination of the load may be changed in some cases. Japanese Patent No. 4337683 discloses a technique such that in a case where a load cannot be placed at a load port which is the transport destination of the load because there is another load at the load port, the transport destination of the load is changed to a buffer adjacent to or in a vicinity of the load port. Accordingly, to reliably prevent the transport vehicle from erroneously transferring the load to the transport destination before the change was made, the host controller first transmits an instruction to the transport controller to cancel the execution of the host transport instruction. Upon receiving the instruction, the transport controller transmits a cancellation instruction to delete the transport instruction to the transport vehicle to which the transport instruction on the basis of the host transport instruction is assigned. Upon receiving the cancellation instruction, the transport vehicle temporarily stops, and deletes the transport instruction assigned to the transport vehicle. Then the transport vehicle transmits to the transport controller a report which indicates completion of the deletion. Upon receiving the report, the transport controller transmits to the host controller a report which indicates the completion of the deletion of the transport instruction on the basis of the host transport instruction. Upon receiving this report, the host controller transmits to the transport controller a host transport instruction to transport the load to a new transport destination. That is, if the transport vehicle does not transmit to the transport controller (the host controller) the report which indicates the completion of the deletion of the transport instruction assigned to the transport vehicle, no transport instruction to transport the load to a new transport destination will be issued.

However, in the transport system mentioned above, the transport vehicle which has received the cancellation instruction needs to stop temporarily before transmitting the report indicating the completion of the transport instruction deletion, and this is a factor which can reduce the efficiency of transport.

SUMMARY OF THE INVENTION

Preferred embodiments of the present invention provide transport systems, transport controllers, and transport vehicle control methods that are each able, without stopping a transport vehicle with a transport instruction having been provided to the transport vehicle, to provide the transport vehicle with a transport instruction to transport a load to a new transport destination.

A transport system according to a preferred embodiment of the present invention is a transport system including a transport vehicle which travels along a predetermined route and transports an article; and a transport controller which controls the transport vehicle based on a host transport instruction related to article transport and received from a host controller, wherein the transport controller is configured or programmed to include: a transport instructor to provide, in accordance with the host transport instruction received from the host controller, the transport vehicle with a transport instruction to transport an article at a pickup point to an unloading point; an overwriting processor to overwrite, in accordance with a host cancellation instruction to cancel the host transport instruction received from the host controller, the transport instruction provided to the transport vehicle with a move instruction which instructs to travel to a predetermined position and not to unload at the predetermined position, and provide the overwritten instruction to the transport vehicle; and a completion reporter to transmit, upon the overwriting processor completing the overwriting, to the host controller a cancellation completion report indicating completion of the host cancellation instruction.

The transport instructor may provide the transport vehicle for which the overwriting processor has overwritten the move instruction with the transport instruction in accordance with the host transport instruction which is newly issued in relation to the article held by the transport vehicle after the host controller has received the cancellation completion report. The overwriting processor may set, as the predetermined position, any position from the current position of the transport vehicle, the instruction for which has been overwritten with the move instruction, to a branching portion on the route in a traveling direction. The overwriting processor may set, when a transport vehicle with the transport instruction provided thereto is traveling toward a pickup point, any position from the current position of the transport vehicle to the pickup point as the predetermined position, and may set, when the transport vehicle is traveling toward an unloading point, any position from the current position of the transport vehicle to the unloading point as the predetermined position. As the predetermined position, when the overwriting processor overwrites the transport instruction and provides the move instruction, if the transport vehicle is traveling toward a pickup point, the transport instructor may provide the transport vehicle only with a transport instruction designated for the same pickup point as that in the overwritten transport instruction, for a predetermined period of time after the move instruction is provided.

A transport controller according to a preferred embodiment of the present invention is a transport controller to control a transport vehicle which travels along a predetermined route and transports an article based on a host transport instruction related to article transport and received from a host controller, the transport controller including a transport instructor to provide, in accordance with the host transport instruction received from the host controller, the transport vehicle with a transport instruction to transport an article at a pickup point to an unloading point; an overwriting processor to overwrite, in accordance with a host cancellation instruction to cancel the host transport instruction received from the host controller, the transport instruction provided to the transport vehicle with a move instruction which instructs to travel to a predetermined position and not to unload at the predetermined position, and which provides the overwritten instruction to the transport vehicle; and a completion reporter to transmit, upon the overwriting processor completing the overwriting, to the host controller a cancellation completion report indicating the completion of the host cancellation instruction.

A transport vehicle control method according to a preferred embodiment of the present invention is a transport vehicle control method to control a transport vehicle that travels along a predetermined route and transports an article, the method including providing, in accordance with a host transport instruction related to article transport and received from a host controller, the transport vehicle with a transport instruction to transport an article at a pickup point to an unloading point; overwriting, in accordance with a host cancellation instruction to cancel the host transport instruction received from the host controller, the transport instruction provided to the transport vehicle with a move instruction that instructs to travel to a predetermined position and not to unload at the predetermined position, and providing the overwritten instruction to the transport vehicle; and transmitting, upon completion of the overwriting with the move instruction, to the host controller a cancellation completion report indicating completion of the host cancellation instruction.

According to the transport systems, the transport controllers, and the transport vehicle control methods according to the preferred embodiments of the present invention, when a host cancellation instruction is received from the host controller, the transport controller overwrites a transport instruction provided to a transport vehicle with a move instruction which instructs to travel to a predetermined position and not to perform unloading at the predetermined position, rather than deleting the transport instruction. By transmitting, upon completion of the overwriting, to the host controller a report indicating the completion of the host cancellation instruction, a new transport instruction transmitted from the host controller in accordance with the completion report is able to be re-assigned to the transport vehicle, without stopping the transport vehicle with a transport instruction having been assigned to the transport vehicle. According to the transport systems, the transport controllers, and the transport vehicle control methods according to the preferred embodiments of the present invention, the overwriting processor of the transport controller overwrites, in accordance with a host cancellation instruction, a transport instruction assigned to a transport vehicle with a move instruction which instructs to travel to a predetermined position and not to perform unloading at the predetermined position, and the completion reporter transmits a cancellation completion report to the host controller. As a result, the cancellation completion report is able to be transmitted to the host controller early and reliably without stopping the transport vehicle. According to the transport system, the transport controller, and the transport vehicle control method according to the preferred embodiments of the present invention, the host controller is able to, upon receiving a cancellation completion report, transmit a new host transport instruction to the transport controller, and the transport controller assigns a new transport instruction to the traveling transport vehicle based on this host transport instruction. As a result, a reduction associated with cancellation of the host transport instruction in the efficiency of article transport is able to be significantly reduced or prevented. The transport system, the transport controller, and the transport vehicle control method are able to be implemented by only changing the transport controller without changing the host controller in an existing transport system, and are able to therefore be easily introduced at low cost.

In a mode in which the transport instructor assigns the transport vehicle, for which the overwriting processor has overwritten the move instruction, with the transport instruction in accordance with the host transport instruction which is newly issued in relation to the article held by the transport vehicle after the host controller has received the cancellation completion report, if the new host transport instruction related to the article held by the transport vehicle for which the transport instruction has been overwritten by the overwriting processor is assigned to another transport vehicle, articles need to be exchanged and the efficiency of transport is reduced. However, according to the present mode, the host transport instruction newly issued in relation to an article held by a transport vehicle is assigned to that transport vehicle, and as a result, a reduction in the efficiency of transporting the article is able to be significantly reduced or prevented.

In a mode in which the overwriting processor sets, as a predetermined position, any position from the current position of the transport vehicle with the transport instruction having been overwritten therefor, to a branching portion on the route in a traveling direction, the destination of the move instruction is a position on the route along which the transport vehicle was scheduled to travel, and since the transport vehicle is already traveling on that route, the transport vehicle is able to travel on the new route. As a result, the overwriting process for the transport vehicle V is able to be executed more reliably.

In a mode in which the overwriting processor sets, when a transport vehicle with the transport instruction assigned to the transport vehicle is traveling toward a pickup point, any position from the current position of the transport vehicle to the pickup point as the predetermined position, and sets, when the transport vehicle is traveling toward an unloading point, any position from the current position of the transport vehicle to the unloading point as the predetermined position, the new destination of the transport vehicle overwritten by the overwriting processor is the same as the destination of the transport instruction before the transport instruction of the transport vehicle was overwritten. Therefore, burden on the transport controller is able to be significantly reduced by performing the overwriting process easily.

In a mode in which when the overwriting processor overwrites the transport instruction and assigns the move instruction, if the transport vehicle is traveling toward a pickup point, the transport instructor may assign the transport vehicle only with a transport instruction designated for the same pickup point as that in the overwritten transport instruction, for a predetermined period of time after the move instruction is assigned, since the transport vehicle for which transport instruction has been canceled is traveling toward the pickup point, the transport vehicle is able to be instructed to pick up an article at the pickup point early by assigning a new transport instruction to the transport vehicle, and a reduction in the efficiency of transporting the article is able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 2:
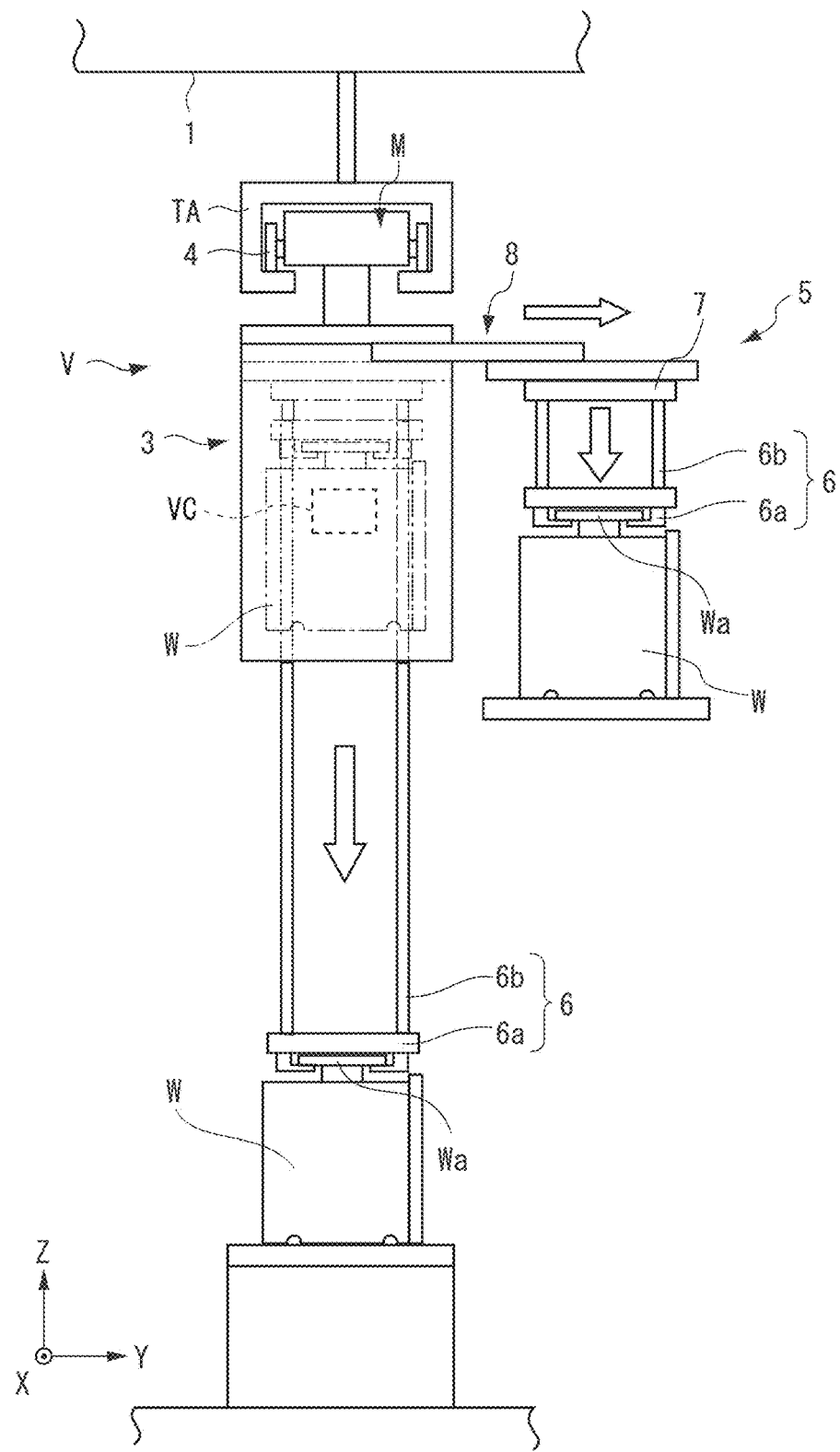
FIG. 2 is a diagram showing an example of a transport vehicle.

The following describes preferred embodiments of the present invention, with reference to the drawings. However, the present invention is not limited to the preferred embodiments. Note that, in the drawings, the scale may be changed to show the preferred embodiments, for example, by enlarging or by emphasizing a portion. In FIG. 2, an XYZ coordinate system is used to describe directions in the figure. In this XYZ coordinate system, a plane that is parallel or substantially parallel to a horizontal plane is defined as an XY plane. In this XY plane, a traveling direction of a transport vehicle V is denoted as an X direction, and a direction orthogonal or substantially orthogonal to the X direction is denoted as a Y direction. A direction perpendicular or substantially perpendicular to the XY plane is denoted as a Z direction. For each of the X direction, the Y direction, and the Z direction, description is provided with a definition in which a direction shown by an arrow is the positive (+) direction and a direction opposite to the direction shown by the arrow is the negative (−) direction.

Figure 1:
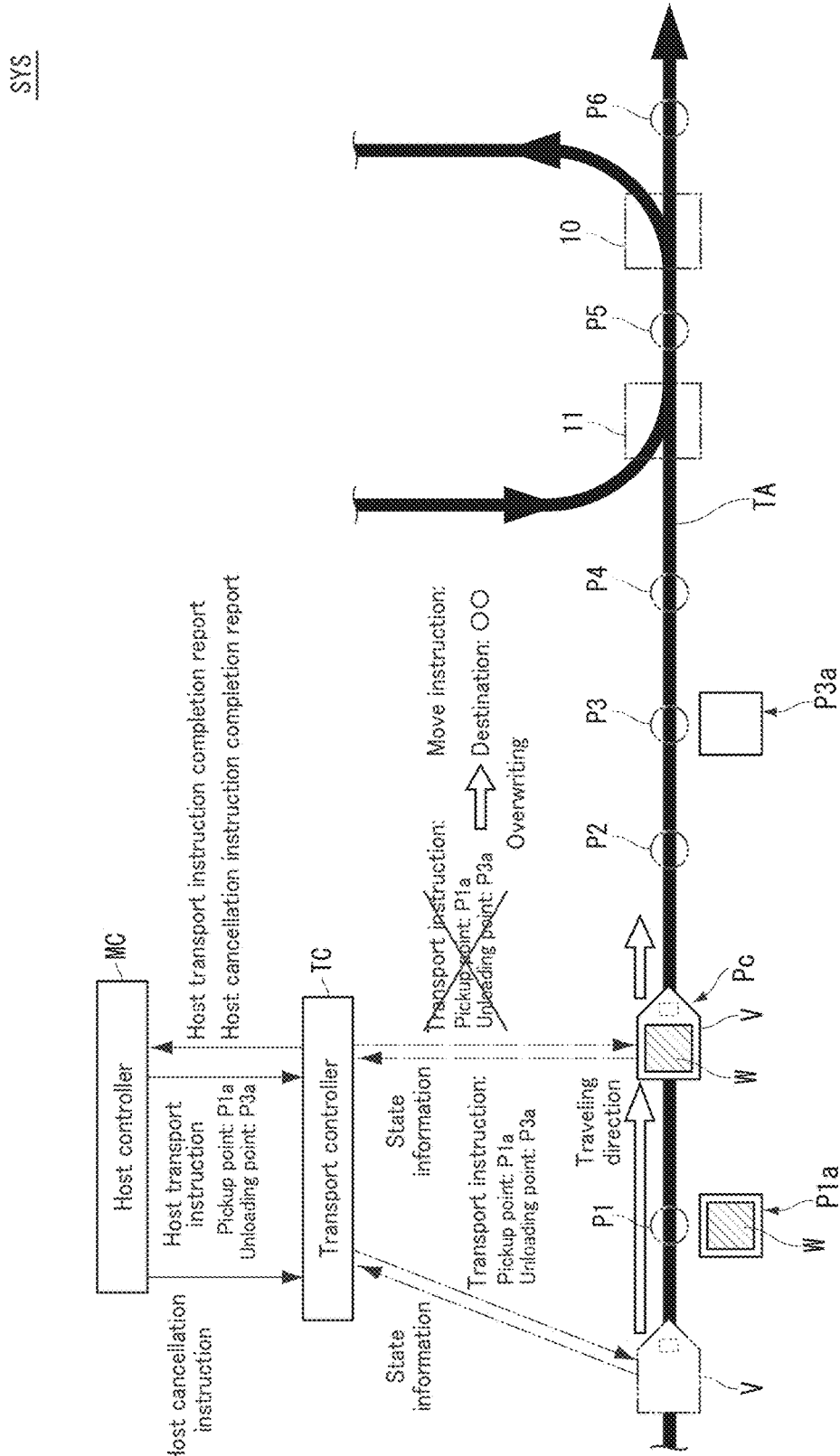
FIG. 1 is a diagram showing an example of a transport system according to a preferred embodiment of the present invention.

FIG. 1 is a diagram showing an example of the transport system and the transport controller according to a preferred embodiment of the present invention. A transport system SYS according to the present preferred embodiment is a system to transport articles W by transport vehicles V. The transport system SYS is installed in, for example, a semiconductor manufacturing factory. The article W is, for example, a FOUP, a SMIF pod, a reticle Pod, or the like that is able to accommodate wafers, reticles, or the like.

The transport system SYS includes, for example, a host controller MC, a transport controller TC according to the present preferred embodiment, and a plurality of transport vehicles V. In FIG. 1 and so forth, only one of the plurality of transport vehicles V may be shown.

Each transport vehicle V travels along a predetermined track TA (route) and transports an article W. The route TA includes a branching portion 10 and a merging portion 11. The route TA is able to be set arbitrarily. Each transport vehicle V transports the article W according to a transport instruction assigned by the transport controller TC.

The transport vehicle V will be described below. FIG. 2 is a diagram showing an example of the transport vehicle V. The transport vehicle V is an overhead transport vehicle which, for example, travels in the +X direction along the track TA suspended from a ceiling 1 or the like of a building, picks up the article W at a pickup point located on a lower side of (directly below) the track TA or on a lower and lateral side (in a direction including the Y direction) of the track TA, and unloads the article W at an unloading point located on the lower side of the track TA or on the lower and lateral side of the track TA.

The transport vehicle V includes an in-vehicle controller VC. The in-vehicle controller VC controls various operations of the transport vehicle V (for example, traveling, speed control (accelerating, decelerating, and stopping), operations related to execution of load pickup, and operations related to execution of load unloading). The in-vehicle controller VC controls the transport vehicle V according to an instruction transmitted from the transport controller TC. The transport controller TC transmits to the transport vehicle V, for example, the transport instruction described above, a move instruction described later, and so forth as instructions to control the transport vehicle V. The in-vehicle controller VC is a computer device which includes, for example, a CPU, a main memory, a memory storage device, a communication device, and so forth and processes various types of information. The in-vehicle controller VC, for example, processes various information (data), stores information, inputs and/or outputs information, and performs communication (transmitting and receiving).

The in-vehicle controller VC manages state information which indicates the state of the transport vehicle V. The in-vehicle controller VC transmits the state information to the transport controller TC by responding to a state information request transmitted periodically from the transport controller TC. Communications related to the state information request and the status information request which are performed between the in-vehicle controller VC and the transport controller TC, are performed regularly at predetermined time intervals. The transport controller TC receives the status information from the transport vehicles V periodically, and thereby grasps and manages the latest state of the managed transport vehicles V and the latest state of various instructions transmitted to the transport vehicle V by the transport controller TC.

Examples of the state information of the transport vehicle V include: information regarding the current position of the transport vehicle V (current position information); information on traveling (for example, speed and stop state); information on whether or not the article W is held; and information on the state (status) of various instructions transmitted from (assigned by) the transport controller TC. Examples of the information on the state of various instructions in the state information include: information regarding completion or failure (inexecutability) of assignment of various instructions; information regarding completion or failure of execution of various instructions (for example, transport instruction and move instruction); and information regarding completion or failure of execution of operations or processes related to various instructions (for example, traveling, pickup, unloading). By receiving the state information transmitted periodically from the transport vehicles V, the transport controller TC grasps the state of the transport vehicle V and the execution state of instructions for the transport vehicles V, and manages and controls the transport vehicle V.

The transport vehicle V includes traveler M and a main body 3. The traveler M includes wheels 4 and travels along the track TA (route) by a traveling driver (not shown in the drawings). The main body 3 is provided in a state of being suspended below the traveler M. The main body 3 includes a transferor 5. The transferor 5 includes: an article holder 6 which holds the article W; a lift driver 7 which raises or lowers the article holder 6; and a lateral extender 8 which moves the lift driver 7 in a direction lateral to (in the +Y direction or the −Y direction of) the track TA.

The article holder 6 is, for example, a chuck having movable claws 6a, and inserts the claws 6a under a flange Wa of the article W to thereby suspend and hold the article W. The article holder 6 is connected to suspenders 6b for example, wires and belts. The lift driver 7 is, for example, a hoist, and raises or lowers the article holder 6 by feeding out or taking up the suspenders 6b. The lateral extender 8 causes a plurality of movable plates to slide to thereby move the article holder 6 and the lift driver 7 to the lateral side of the track TA from the position at which the article holder 6 and the lift driver 7 are stored in the main body 3. Pickup and unloading of the article W performed by the transport vehicle V is performed by the article holder 6, or the lift driver 7 and the lateral extender 8 described above. Operations of the article holder 6, the lift driver 7, and the lateral extender 8 are controlled by the in-vehicle controller VC.

When an article W is to be picked up at a pickup point, the in-vehicle controller VC stops the transport vehicle V to align the transport vehicle V with the pickup point and controls the lift driver 7, or the lift driver 7 and the lateral extender 8 to operate and move the article holder 6 to a predetermined position, thereby instructing to pick up the article W at the pickup point. For example, when the pickup point in a transport instruction is a position P1a (a pickup point P1a) shown in FIG. 1, the in-vehicle controller VC stops the transport vehicle V at a position P1 (a position on the route TA corresponding to the pickup point) which aligns with the pickup point P1a, and controls each element of the transport vehicle V to control the lift driver 7 and the lateral extender 8 to operate and perform pickup of the article W at the pickup point P1a. The pickup point is able to be arbitrarily set in the transport system SYS. Examples of the pickup point include a load port of a processing apparatus or a stocker, and an overhead buffer provided with a shelf suspended from a ceiling 1 of the building on which the article W is able to be placed.

When unloading the article W at the unloading point, the in-vehicle controller VC stops the transport vehicle V to align the transport vehicle V with the unloading point and controls the lift driver 7, or the lift driver 7 and the lateral extender 8 to operate and move the article holder 6 to the predetermined position, thereby instructing to pick up the article W at the pickup point. For example, when the unloading point in a transport instruction is a position P3a (a unloading point P3a) shown in FIG. 1, the in-vehicle controller VC stops the transport vehicle V at a position P3 (a position on the route TA corresponding to the unloading point) which aligns with the unloading point, and controls each element of the transport vehicle V to control the lift driver 7 and the lateral extender 8 to operate and perform unloading of the article W at the unloading point P3a. The unloading point is able to be arbitrarily set in the transport system SYS. Examples of the unloading point include a load port of a processing apparatus or a stocker, and an overhead buffer provided with a shelf suspended from a ceiling 1 of the building on which the article W is able to be placed.

The transport controller TC and the in-vehicle controller VC are connected to wirelessly communicate with each other via a transmission path, for example, wireless LAN (Local Area Network) or feeder communication via a feeder line. The transport controller TC and the host controller MC are connected to communicate with each other via a transmission line, for example, a wired LAN or a wireless LAN.

Figure 3:
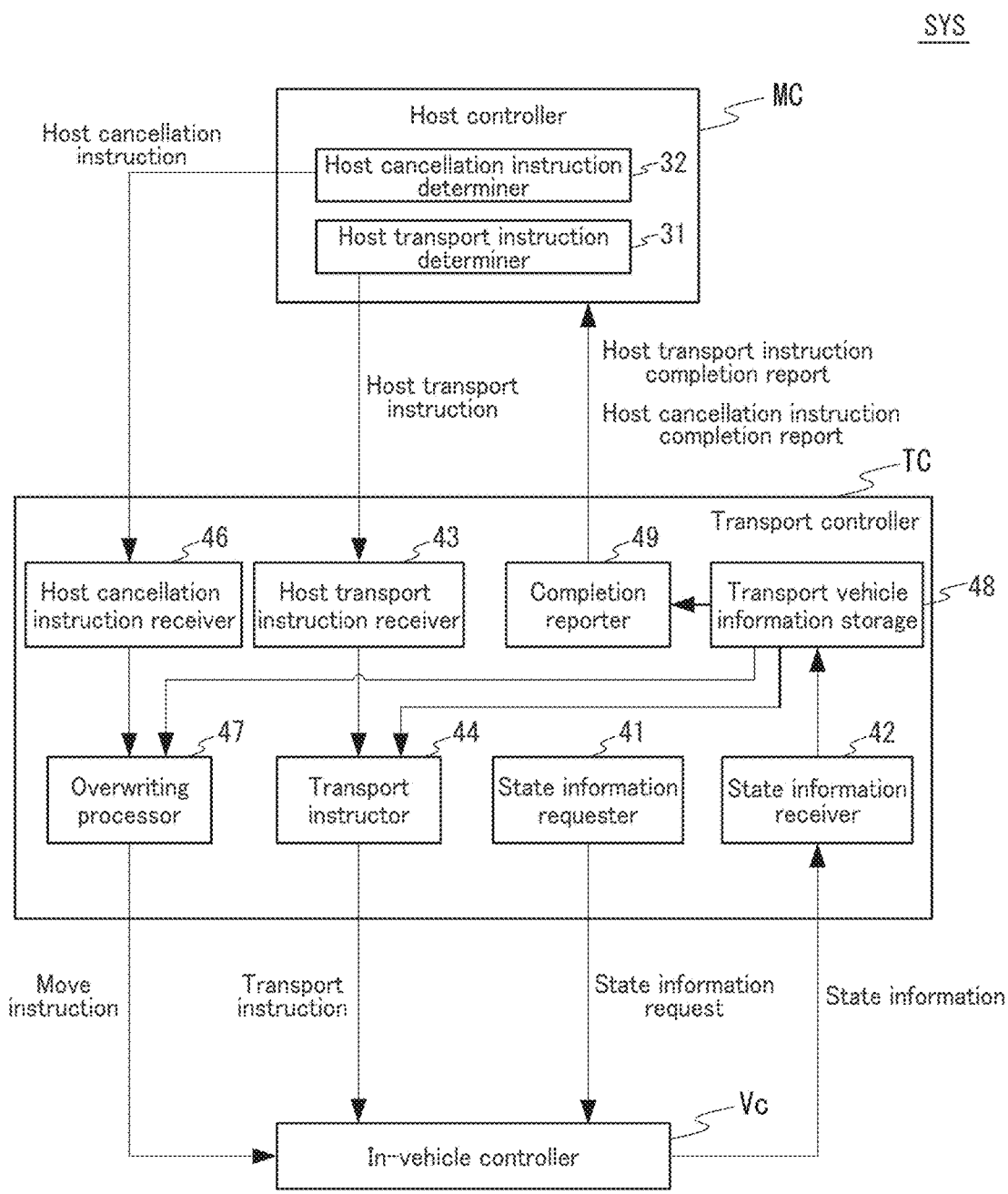
FIG. 3 is a diagram showing an example of a transport controller.

FIG. 3 is a diagram showing an example of the host controller MC and the transport controller TC. The host controller MC includes a host transport instruction determiner 31 and a host cancellation instruction determiner 32. The host controller MC is a computer device which includes, for example, a CPU, a main memory, a memory storage device, a communication device, and so forth and processes various types of information. The host controller MC, for example, processes various information (data), stores information, inputs and/or outputs information, and performs communication (transmitting and receiving).

The host controller MC controls transportation of the articles W. Each component or element of the system including the transport controller TC transmits to the host controller MC information related to the state of each pickup point or each unloading point, information related to the state of an instruction transmitted to the transport controller TC from the host controller MC, and so forth, and the host controller MC manages information on the position of each article W, information on the state of each pickup point or each unloading point (for example, the operating state of a device, the state of occupancy of article W), information related to the state of an instruction transmitted to the transport controller TC from the host controller MC (for example, being executed, execution completed, execution failed), and so forth.

The host controller MC transmits to the transport controller TC a host transport instruction, which is an instruction to transport a predetermined article W from a transport origin to a transport destination, and controls, via the transport controller TC, transport of the article W performed by the transport vehicle V. The host transport instruction includes, for example, pickup point information regarding the position of a transport target article W (transport origin, pickup point), unloading point information regarding the position of the transport destination of the transport target article W (may be abbreviated as "unloading point" in some cases), and an instruction which instructs to transport the article W at the pickup point to the unloading point.

In the host controller MC, the host transport instruction determiner 31 determines execution of a host transport instruction. The host transport instruction determiner 31 generates a host transport instruction and transmits it to the transport controller TC. The host transport instruction determiner 31 determines execution of the host transport instruction based on, for example, information related to the state of each pickup point or the state of each unloading point.

The host cancellation instruction determiner 32 determines execution of a host cancellation instruction which instructs to cancel execution of a host transport instruction. The host cancellation instruction determiner 32 generates a host cancellation instruction and transmits it to the transport controller TC. The host cancellation instruction determiner 32 determines execution of the host cancellation instruction based on, for example, information related to the state of each pickup point or the state of each unloading point, and generates the host cancellation instruction. For example, when the host controller MC detects a pickup point or an unloading point as being unusable due to a problem, the host cancellation instruction determiner 32 determines execution of the host cancellation instruction based on the detected information, and generates a host cancellation instruction.

The transport controller TC controls the transport vehicles V. The transport controller TC transmits various instructions to the transport vehicles V to thereby control the transport vehicles V. The transport controller TC includes, for example, a state information requester 41, a state information receiver 42, a host transport instruction receiver 43, a transport instructor 44, a host cancellation instruction receiver 46, an overwriting processor 47, a transport vehicle information storage 48, and a completion reporter 49. The transport controller TC is a computer device which includes, for example, a CPU, a main memory, a memory storage device, a communication device, and so forth and processes various types of information. The transport controller TC, for example, processes various information (data), stores information, inputs and/or outputs information, and performs communication (transmitting and receiving). The transport controller TC stores information to control each transport vehicle V (for example, route information (map information)), or a control program in a storage device not shown in the drawings. The transport controller TC shown in FIG. 3 is merely an example, and other implementations may be used.

The state information requester 41 transmits to each transport vehicle V a state information request to request (instruct) the transport vehicle V to report the state information thereof. The state information requester 41, for example, periodically transmits the state information request to each of the plurality of transport vehicles V under the management of the transport controller TC, at predetermined time intervals (for example, 1 second or less). Upon receiving the state information request, each transport vehicle V immediately transmits status information thereof to the transport controller TC as a response to the status information request.

The state information receiver 42 receives state information from each transport vehicle V. The state information received by the state information receiver 42 from each transport vehicle V is stored in the transport vehicle information storage 48. Based on the state information from each transport vehicle V stored in the transport vehicle information storage 48, the transport controller TC acquires information related to: the state of each transport vehicle V (for example, the current position of the transport vehicle V, the traveling state (traveling, stopped), whether or not a load is held, completion of pickup or unloading operation); and the state of the instruction (for example, a transport instruction, a move instruction) transmitted to the transport vehicle V from the transport controller TC (for example, instruction assignment completed, instruction assignment failed, instruction being executed, instruction execution completed, instruction execution failed), and manages these pieces of information.

The host transport instruction receiver 43 receives a host transport instruction from the host controller MC. The host transport instruction receiver 43 transmits the received host transport instruction to the transport instructor 44.

The transport instructor 44, in accordance with the host transport instruction received from the host controller MC, assigns the transport vehicle V with a transport instruction to transport an article W at a pickup point to an unloading point.

The transport instruction is an instruction to control the transport vehicle V to execute transport of an article W based on a host transport instruction. The host transport instruction includes, for example: pickup point information and unloading point information as with the host transport instruction; and an instruction which instructs the transport vehicle V to travel to and stop at a position corresponding a pickup point, pick up the article W at the pickup point, travel to and stop at a position corresponding to an unloading point, and unload the article W at the unloading point.

The transport instructor 44 determines (selects), from the plurality of transport vehicles V, a transport vehicle V to perform transport of the article W based on the host transport instruction, and assigns a transport instruction to the determined transport vehicle V. The transport instructor 44 determines the transport vehicle V to which the transport instruction is assigned, based on, for example, information included in the host transport instruction (for example, pickup point information, unloading point information) and information regarding the state of each transport vehicle V (for example, state information (the current position information)). Transport instruction assignment performed by the transport instructor 44 will be further described later.

The transport vehicle V to which a transport instruction or a move instruction is assigned transmits an assignment completion report which indicates that the instruction has been assigned normally to the transport controller TC as state information. When execution of the assigned transport instruction or the assigned move instruction has completed, a transport (move) completion report which indicates completion of the execution of the assigned transport instruction (or the move instruction) has been completed is transmitted to the transport controller TC as state information. When an instruction to delete (cancel) the assigned transport instruction or the assigned move instruction is received from the transport controller TC and instruction deletion has been completed normally, a deletion completion report which indicates completion of the instruction deletion is transmitted to the transport controller TC as state information. When the transport vehicle V is unable to execute the transport instruction assigned to the transport vehicle by the transport controller TC (when the transport instruction is not able be assigned to the transport vehicle), the transport vehicle V transmits a report which indicates failure of the transport instruction assignment to the transport controller TC as state information. In the case where the transport vehicle V is in a state (status) of being unable to execute transport related operations, for example, where the transport vehicle V is having a problem with a device to perform transport related operations or is in a state (status) of being unable to stop at the pickup point or the unloading point, the in-vehicle controller VC determines the transport instruction assigned by the transport controller TC as being inexecutable, and transmits a report indicating a failure of the transport instruction assignment to the transport controller TC as state information.

In the case where the state information receiver 42 receives a transport completion report from a transport vehicle V, the completion reporter 49 transmits to the host controller MC a host transport instruction completion report which indicates that the host transport instruction corresponding to the transport instruction for which the transport completion report has been received is completed. In the case where the state information receiver 42 receives an overwriting completion report from a transport vehicle V, the completion reporter 49 transmits to the host controller MC a host cancellation instruction completion report which indicates that deletion of the host transport instruction corresponding to the transport instruction for which the overwriting completion report has been received is completed. The host controller MC receives the host transport instruction completion report or the host cancellation instruction completion report from the transport controller TC to thereby grasp that the host transport instruction which was transmitted to the transport controller TC by the host controller MC itself has been completed or deleted.

The host cancellation instruction receiver 46 receives a host cancellation instruction from the host controller MC. Upon receiving the host cancellation instruction, the host cancellation instruction receiver 46 transmits information related to the host cancellation instruction to the overwriting processor 47.

The overwriting processor 47 overwrites the transport instruction assigned to the transport vehicle V in accordance with the host cancellation instruction to cancel the host transport instruction received from the host controller MC, with a move instruction which instructs to travel to a predetermined position and not to unload at the predetermined position (hereunder, abbreviated as "move instruction"). By overwriting the transport instruction assigned to the transport vehicle V with the move instruction, a state where the transport instruction is not assigned to the transport vehicle V may be provided, and as a result, a state where the transport instruction which was assigned to the transport vehicle V has been deleted may be provided.

A move instruction includes, for example, information regarding a predetermined position and an instruction controlling a transport vehicle V to travel to the predetermined position. The predetermined position in the move instruction is able to be set arbitrarily. The overwriting processor 47 of the present preferred embodiment sets, as a predetermined position, any position from the current position of the transport vehicle V, the instruction for which has been overwritten with the move instruction, to a branching portion 10 on the route in the traveling direction.

The state of the transport vehicle V shown by the solid line in FIG. 1 is as follows: the transport vehicle V picks up the article W from the pickup point (pickup point P1a) at the position P1a; the transport vehicle V travels to the position P3 corresponding to the unloading point (unloading point P3a) at the position P3a; a transport instruction to unload the article W at the unloading point P3a is assigned to the transport vehicle V; having picked up the article W at the pickup point P1a, the transport vehicle V is traveling toward the position P3 corresponding to the unloading point P3a; and the current position of the transport vehicle V is the position Pc (hereunder, may be abbreviated as "example of FIG. 1").

In the case of the "example of FIG. 1" described above, the overwriting processor 47 sets, as the predetermined position in the move instruction, any of positions P2, P3, P4, P5 from the current position Pc of the transport vehicle V, the instruction for which has been overwritten with the move instruction, to the branching portion 10 on the route TA in the traveling direction, and the position P6 which is a position past the branching portion 10 on the route TA in the traveling direction is excluded from being set as the predetermined position in the move instruction.

When the move instruction is received, the transport vehicle V determines whether or not the route to the destination of the move instruction is able to be traveled, and transmits to the transport controller TC a report of normal assignment of the move instruction if traveling is able to be performed, and transmits to the transport controller TC a report indicating that the move instruction is not able be assigned if traveling is not able to be performed. In the implementation where the overwriting processor 47 sets, as a predetermined position, any position from the current position of the transport vehicle V to the branching portion 10 on the route in the traveling direction, the branching portion 10 is not included on the route between the new traveling destination of the transport vehicle V with its transport instruction having been overwritten by the overwriting processor 47 and the current position of the transport vehicle V. Accordingly, the destination of the move instruction is a position on the route TA along which the transport vehicle V was scheduled to travel, and since the transport vehicle V is already traveling on that route, the transport vehicle V is able to travel on the new route TA. As a result, the overwriting process for the transport vehicle V is able to be executed more reliably.

In the case where the host controller MC transmits a host cancellation instruction, the transport vehicle V should not perform pickup at the pickup point or should not perform unloading at the unloading point designated in the transport instruction corresponding to the host cancellation instruction. In the conventional technique, when the host controller MC transmitted a host cancellation instruction, the transport controller TC transmitted a delete instruction to the transport vehicle V to which a transport instruction corresponding to the host cancellation instruction was assigned. After receiving the delete instruction, the transport vehicle V decelerated and stopped, and transmitted a deletion completion report of the transport instruction to the transport controller TC when it came to a stop. With this processing, the transport vehicle V was prevented from performing pickup at the pickup point or unloading at the unloading point designated in the transport instruction corresponding to the host cancellation instruction.

In the present preferred embodiment, when the host controller MC transmits a host cancellation instruction, the transport controller TC transmits a move instruction to the transport vehicle V to which a transport instruction corresponding to the host cancellation instruction is assigned, and by overwriting the transport instruction with the move instruction, a state where the transport instruction is not assigned to the transport vehicle V may be provided. Here, if the processing of overwriting the move instruction is not performed smoothly for the transport vehicle V, the transport vehicle V may perform pickup at the pickup point or unloading at the unloading point designated in the transport instruction corresponding to the host cancellation instruction. The overwriting processor 47 in the present preferred embodiment reliably performs the overwriting processing for the transport vehicle V by overwriting the transport instruction with a move instruction where a position on the route TA on which the transport vehicle V was scheduled to travel is designated as a destination. With this processing, the transport vehicle V is prevented from performing pickup at the pickup point or unloading at the unloading point designated in the transport instruction corresponding to the host cancellation instruction.

On the other hand, in the case where the branching portion 10 is included in the route TA from the current position Pc to the destination of the transport vehicle V, since there are multiple routes TA on which the target transport vehicle V of the overwriting process may travel, there is a higher possibility that the transport vehicle V is not able be overwritten with a move instruction, compared with the case where there is a single route TA from the current position to the new destination of the transport vehicle V for which the transport instruction described above has been overwritten. In addition, processing of determining whether or not a predetermined position of the move instruction is able to be set needs to be performed on each of the plurality of routes TA on which the target transport vehicle V of the overwriting process may travel. As a result, the processing becomes complicated.

In the case where the transport vehicle V is traveling toward a pickup point defining and functioning as the predetermined position in the move instruction, the overwriting processor 47 sets a position corresponding to the pickup point in the transport instruction assigned to the transport vehicle V as the predetermined position. For example, any position from the current position of the transport vehicle V to the pickup point is set as the predetermined position. In the case where the transport vehicle V is traveling toward an unloading point, the position corresponding to the unloading point in the transport instruction assigned to the transport vehicle V is set as the predetermined position. For example, any position from the current position of the transport vehicle V to the unloading point is set as the predetermined position. In the example of FIG. 1 described above, in the overwriting processor 47 of this implementation, since the target transport vehicle V of the overwriting processing is traveling toward the unloading point P3a, the predetermined position of the move instruction is set to the position P3 corresponding to the unloading point P3a.

As described above, in the implementation where when the transport vehicle V is traveling toward the pickup point, the overwriting processor 47 sets the position corresponding to the pickup point in the overwritten transport instruction as the predetermined position, and when the transport vehicle V is traveling toward the unloading point, the overwriting processor 47 sets the position corresponding to the unloading point as the predetermined position, the new destination of the transport vehicle V overwritten by the overwriting processor 47 is the same as the destination of the transport instruction before the transport instruction of the transport vehicle was overwritten. Accordingly, the transport vehicle V is able to travel on the new route TA since the transport vehicle V has already been traveling on that route TA. As a result, the overwriting process for the transport vehicle V is able to be executed more reliably. Also, burden on the transport controller TC is able to be significantly reduced by performing the overwriting process easily.

When a move instruction is assigned by the overwriting processor 47, the transport vehicle V immediately executes the move instruction and travels to the destination based on the move instruction. That is, in the transport system SYS (the transport controller TC) of the present preferred embodiment, when the host controller MC executes a host cancellation instruction, the transport vehicle V immediately starts traveling based on the move instruction, and the transport vehicle V does not stop and maintains the traveling state thereof. With this processing, in the transport system SYS (the transport controller TC) of the present preferred embodiment, a reduction associated with cancellation of the host transport instruction is able to be significantly reduced or prevented in the transport efficiency of the system.

When the move instruction is assigned normally by the overwriting processor 47, the transport vehicle V transmits to the transport controller TC a report to that effect, that is, an overwriting completion report indicating that the overwriting of the move instruction on the transport instruction has been completed, as a state report. The overwriting completion report includes information regarding completion of deletion of the host transport instruction.

When the overwriting processor 47 overwrites a transport instruction with a move instruction, the completion reporter 49 transmits to the host controller MC a host cancellation instruction completion report (a cancellation completion report) which indicating completion of execution of a host cancellation instruction (deletion of a host transport instruction). The completion reporter 49 transmits the host cancellation instruction completion report (the cancellation completion report) to the host controller MC when the overwriting processor 47 completes overwriting. The completion reporter 49 immediately transmits the host cancellation instruction completion report to the host controller MC when the state information receiver 42 receives an overwriting completion report from the transport vehicle V.

The host controller MC receives the host cancellation instruction completion report from the completion reporter 49 to thereby grasp that execution of the host cancellation instruction which was transmitted to the transport controller TC by the host controller MC itself has been completed.

The host controller MC transmits a new host transport instruction related to the article W of the canceled host transport instruction to the transport controller TC on condition that the host cancellation instruction completion report has been received from the transport controller TC. That is, in the transport system SYS (the transport controller TC) of the present preferred embodiment, when the host controller MC cancels execution of the host transport instruction and transmits a new host transport instruction related to the article W of the canceled host transport instruction to the transport controller TC, the host controller MC transmits the new host transport instruction related to the article W of the canceled host transport instruction to the transport controller TC after the host cancellation instruction completion report has been received from the transport controller TC, and thus complies with the SEMI standard. That is, when changing the transport origin or the transport destination of the host transport instruction which has once been transmitted to the transport controller TC, to another transport origin or another transport destination, the host controller MC first transmits a host cancellation instruction for the host transport instruction to the transport controller TC, and transmits a new transport instruction with a changed transport origin or transport destination to the transport controller TC after a host cancellation instruction completion report has been received from the transport controller TC.

Hereunder, transport instruction assignment performed by the transport instructor 44 will be described. The transport instructor 44 determines, from the plurality of transport vehicles V, a transport vehicle V to which a transport instruction is assigned, on a preliminarily set predetermined condition. For example, the transport instructor 44 assigns a transport instruction to a transport vehicle V which has no transport instruction assigned to the transport vehicle and is idle-traveling or to a transport vehicle V on standby. For example, the transport instructor 44 selects an appropriate transport vehicle V from the plurality of transport vehicles V and assigns the transport instruction to the selected transport vehicle V. Accordingly, the transport efficiency in the system is able to be significantly increased.

For example, the transport instructor assigns the transport vehicle V, for which the overwriting processor 47 has overwritten the transport instruction with a move instruction, with a transport instruction in accordance with the host transport instruction which is newly issued in relation to the article W held by the transport vehicle V, after the host controller MC has received the completion report of a host cancellation instruction.

When the host controller MC cancels a host transport instruction, there are many cases where, for a predetermined period of time after the transport controller TC assigned a move instruction to a transport vehicle V, the host controller MC transmits a new host transport instruction to the transport controller TC for the article W related to the canceled host transport instruction. If another transport vehicle V is assigned with a new host transport instruction related to the article W held by the transport vehicle V for which the overwriting processor 47 has overwritten the transport instruction with a move instruction, after the article W held by the transport vehicle V has been unloaded, an exchange of articles W becomes necessary in which the unloaded article W needs to be picked up and transported by another transport vehicle V, resulting in reduction in the transport efficiency. As described above, the transport instructor 44 assigns the transport vehicle V, for which the overwriting processor 47 has overwritten a transport instruction with a move instruction, with a transport instruction in accordance with the host transport instruction which is newly issued in relation to the article W held by the transport vehicle V, after the host controller MC has received the cancellation completion report, and the host transport instruction newly issued in relation to the article W held by a transport vehicle V is assigned to that transport vehicle V. Accordingly, a reduction in the efficiency of transporting the article W is able to be significantly reduced or prevented.

When the overwriting processor 47 overwrites a transport instruction and assigns a move instruction to a transport vehicle V traveling toward a pickup point, the transport instructor 44 may assign the transport vehicle V only with a transport instruction which includes the same pickup point as that in the overwritten transport instruction, for a predetermined period of time after the move instruction is assigned, The predetermined period is able to be set arbitrarily according to, for example, the features of the system, and is set to a few seconds, for example. Another condition other than the one described above may be set as a condition for the transport instructor 44 to assign a transport instruction.

There is a case where, in a situation where there is no transport vehicle V having no transport instruction assigned to the transport vehicle in an area managed by the transport controller TC, the transport controller TC is suspending assignment of a transport instruction corresponding to a host transport instruction which has already been transmitted from the host controller MC. When a transport vehicle V to which no transport instruction is assigned emerges newly, the suspended transport instruction is assigned to that transport vehicle V. Here, since no transport instruction is assigned to the transport vehicle V for which the overwriting processor 47 overwrote the transport instruction and assigned a move instruction, a transport instruction related to an article different from the transport target article W of the original transport instruction (host transport instruction) may be assigned to the transport vehicle V. However, as described above, in the implementation where when the overwriting processor 47 overwrites the transport instruction and assigns the move instruction, the transport instructor 44 assigns the transport vehicle V only with a transport instruction including the same pickup point as that in the overwritten transport instruction, for a predetermined period of time after the move instruction is assigned, since the transport vehicle V for which the transport instruction has been canceled is traveling toward the pickup point, the transport vehicle V is able to be instructed to pick up an article W at the pickup point early by assigning a new transport instruction to the transport vehicle V, and a reduction in the efficiency of transporting the article is able to be significantly reduced or prevented.

Figure 4:
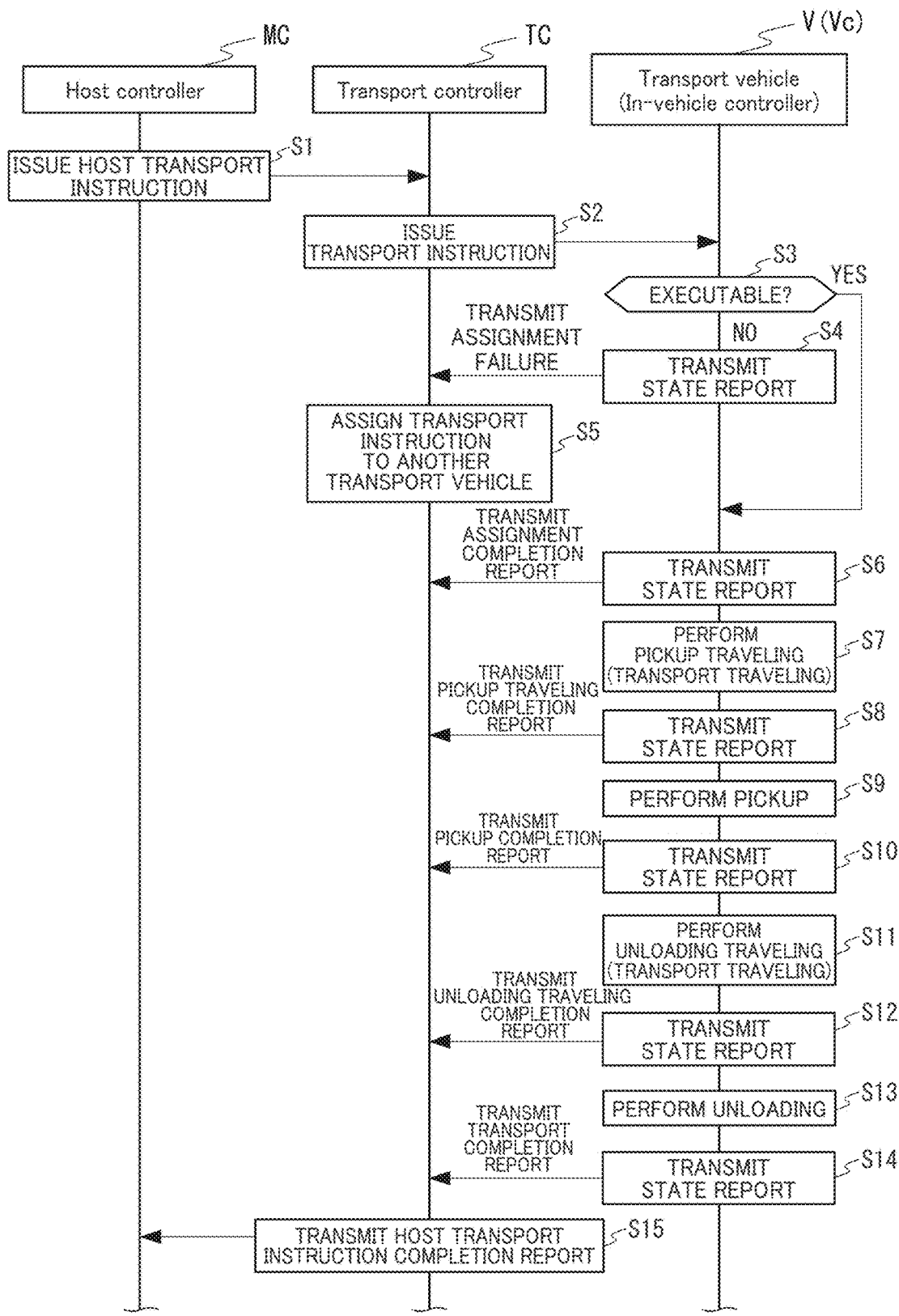
FIG. 4 is a flowchart showing an example of an operation of the transport system.

FIG. 4 is a diagram showing an example of an operation flow of the transport system SYS. First, with reference to the operation flow shown in FIG. 4, here is described an operation of controlling a transport vehicle V to transport an article W based on a host transport instruction of the host controller MC in the transport system SYS. In the present specification, a transport vehicle control method of the present preferred embodiment will be described based on the operation of the transport system SYS. FIG. 5A, FIG. 5B, and FIG. 6A to FIG. 6D are diagrams each showing the operation of the transport system SYS in the operation flow shown in FIG. 4. In the description of the operation flow of FIG. 4, reference will be provided to FIG. 1 to FIG. 6D where appropriate.

Figure 5A:
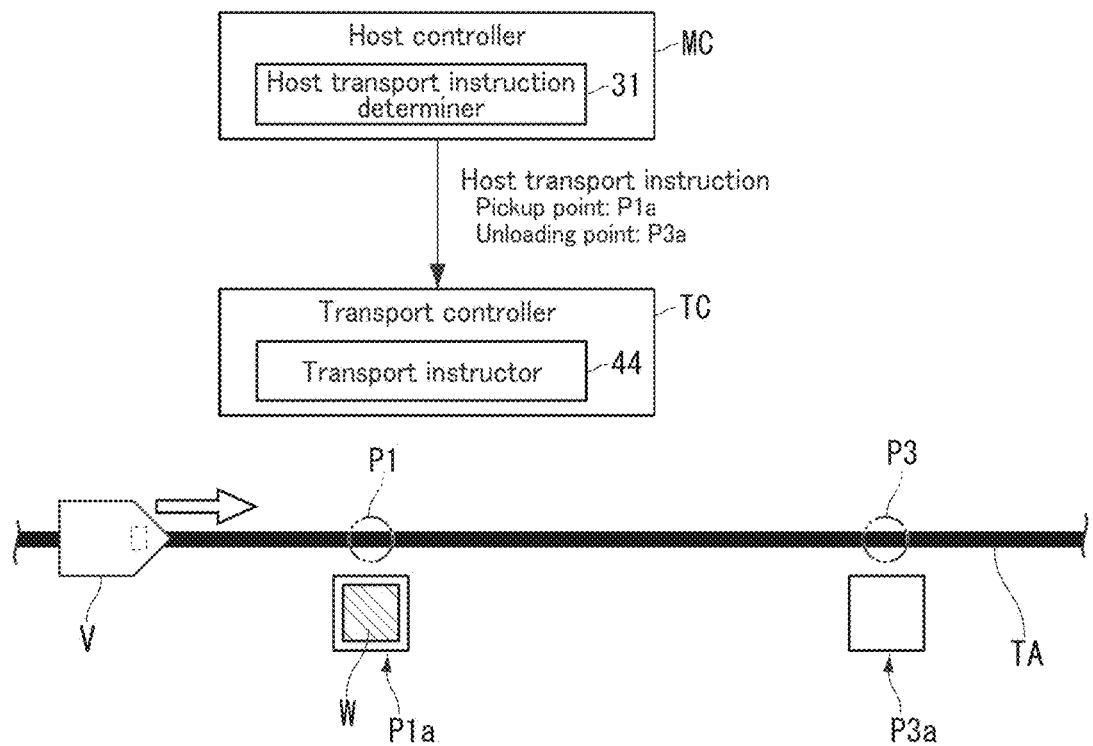
FIG. 5A and FIG. 5B are diagrams showing an example of an operation of the transport system.

In the transport system SYS, when controlling a transport vehicle V to transport an article W based on a host transport instruction of the host controller MC, in Step S1 of FIG. 4, the host transport instruction determiner 31 of the host controller MC determines execution of the host transport instruction and transmits it to the transport controller TC, as shown in FIG. 5A. In the example shown in FIG. 5A, the host transport instruction assumes the article W being the article to be transported, the position P1$a$ being the pickup point thereof, and the position P3$a$ being the unloading point thereof.

The host transport instruction receiver 43 of the transport controller TC (see FIG. 3) receives a host transport instruction transmitted from the host controller MC. The host transport instruction receiver 43 transmits information related to the received host transport instruction to the transport instructor 44.

Figure 5B:
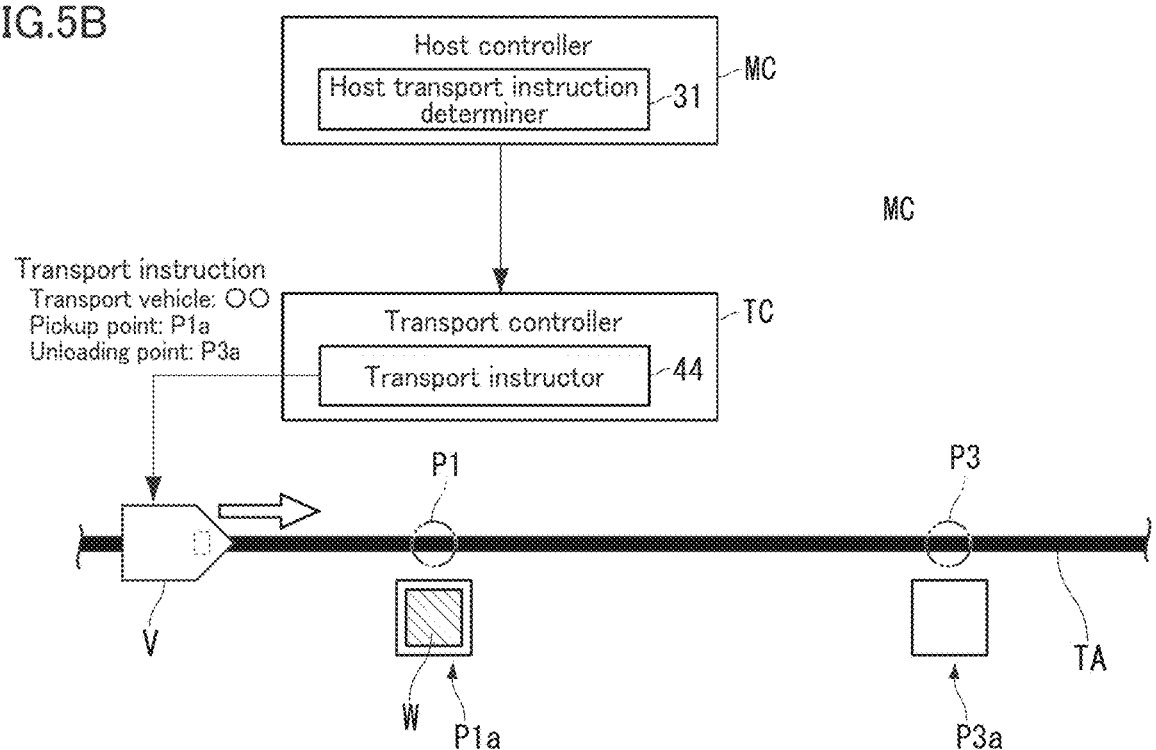

In Step S2 of FIG. 4, as shown in FIG. 5B, the transport instructor 44 of the transport controller TC assigns a transport instruction to the transport vehicle V according to the received host transport instruction. As described above, the transport instructor 44 determines, from the plurality of transport vehicles V, a predetermined transport vehicle V, and transmits the transport instruction to the determined transport vehicle V.

In the example shown in FIG. 5B, the transport instruction includes: pickup point information in which the position P1$a$ is the pickup point; unloading point information in which the position P3$a$ is the unloading point; and an instruction which instructs the transport vehicle V to travel to and stop at the position P1 corresponding the position P1$a$ of the pickup point, pick up the article W at the position P1$a$ of the pickup point, travel to and stop at the position P3 corresponding to the position P3$a$ of the unloading point, and unload the article W at the position P3$a$ of the unloading point.

In Step S3 of FIG. 4, when the in-vehicle controller VC of the transport vehicle V receives the transport instruction from the transport controller TC, the in-vehicle controller VC determines whether or not the received transport instruction is executable.

If the transport instruction received by the in-vehicle controller VC of the transport vehicle V is determined as being inexecutable (Step S3 of FIG. 4; NO), in Step S4, the in-vehicle controller VC reports information regarding a failure of the transport instruction assignment as state information to the transport controller TC (an assignment failure report).

When the state information receiver 42 of the transport controller TC receives the assignment failure report from the transport vehicle V, in Step S5 of FIG. 4, information related to the assignment failure report is transmitted from the transport vehicle information storage 48 to the transport instructor 44, and the transport instructor 44 assigns the transport instruction to another transport vehicle V other than the transport vehicle V for which transport instruction assignment has failed.

If the transport instruction received by the in-vehicle controller VC of the transport vehicle V is determined as being executable (Step S3; YES), the received transport instruction is assigned to the transport vehicle V and the transport vehicle V starts executing the assigned transport instruction. In Step S6, the in-vehicle controller VC reports information regarding completion of the transport instruction assignment as state information to the transport controller TC (an assignment completion report).

Figure 6A:
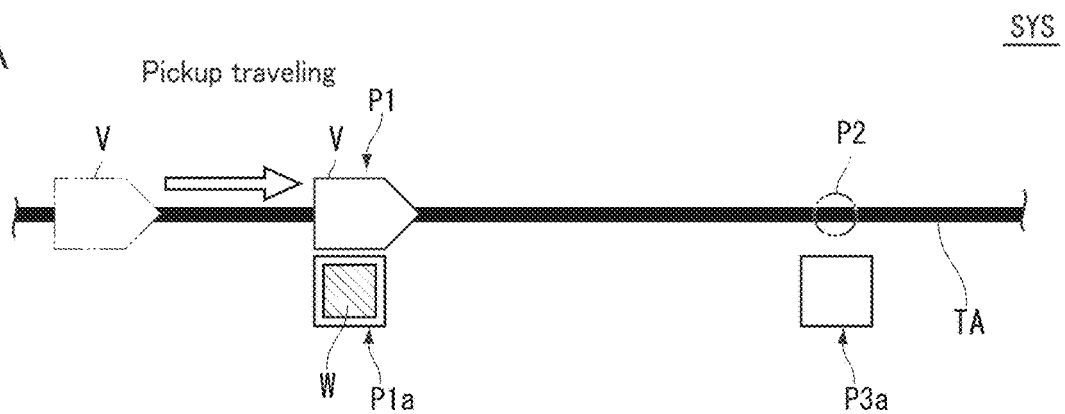
FIG. 6A to FIG. 6D are diagrams showing an example of an operation of the transport system, following the operation of FIG. 5A and FIG. 5B.

When the transport vehicle V executes the assigned transport instruction, in Step S7 of FIG. 4, as shown in FIG. 6A, the transport vehicle V travels to and stops at the position P1 corresponding to the position P1a of the pickup point of the article W according to the transport instruction (pickup traveling).

When the transport vehicle V completes the pickup traveling in Step S7 of FIG. 4, in Step S8, the in-vehicle controller VC reports information regarding completion of the pickup traveling to the transport controller TC as status information (a pickup traveling completion report).

Figure 6B:
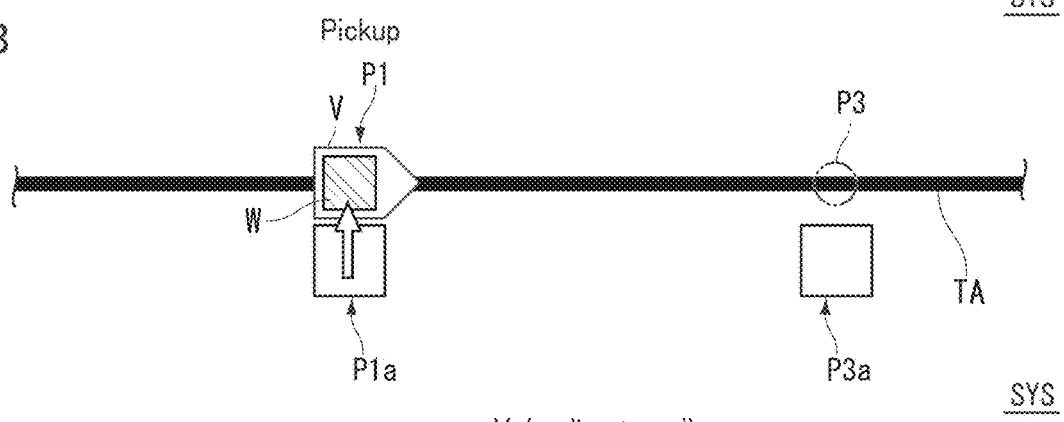

In Step S9 of FIG. 4, as shown in FIG. 6B, the transport vehicle V picks up and holds the article W at the position P1a of the pickup point according to the transport instruction (pickup).

When the transport vehicle V completes the pickup in Step S9 of FIG. 4, in Step S10, the in-vehicle controller VC reports information regarding completion of the pickup to the transport controller TC as status information (a pickup completion report).

Figure 6C:
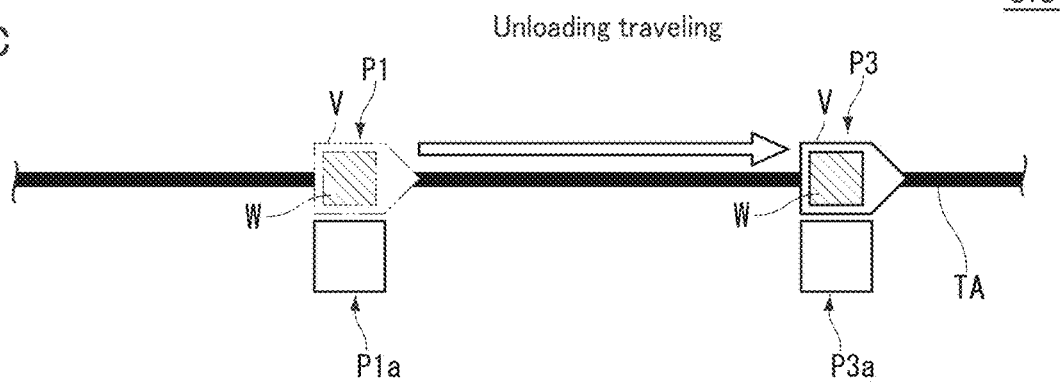

In Step S11 of FIG. 4, as shown in FIG. 6C, the transport vehicle V travels to and stops at the position P3 corresponding to the position P3a of the unloading point of the article W according to the transport instruction (unloading traveling). In the present preferred embodiment, the pickup traveling (Step S7) and the unloading traveling (Step S11) of the transport vehicle V are referred to as "transport traveling".

When the transport vehicle V completes the unloading traveling in Step S11 of FIG. 4, in Step S12, the in-vehicle controller VC reports information regarding completion of the unloading traveling to the transport controller TC as status information (an unloading traveling completion report).

Figure 6D:
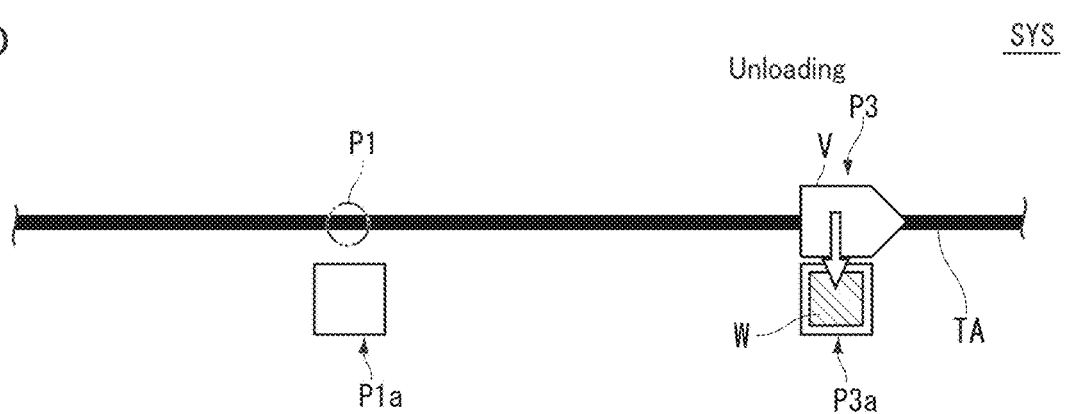

In Step S13 of FIG. 4, as shown in FIG. 6D, the transport vehicle V travels to and stops at the position P3 corresponding to the position P3a of the unloading point of the article W according to the transport instruction (unloading traveling).

When the transport vehicle V completes the unloading traveling in Step S13 of FIG. 4, in Step S14, the in-vehicle controller VC reports information regarding completion of the execution of the transport instruction to the transport controller TC as status information (a transport instruction completion report).

When the state information receiver 42 of the transport controller TC receives the status information including the information regarding the completion of execution of the transport instruction from the transport vehicle V, in Step S15 of FIG. 4, information regarding the completion of execution of the transport instruction is transmitted from the transport vehicle information storage 48 to the completion reporter 49, and the completion reporter 49 transmits a host transport instruction completion report regarding the completion of execution of the host transport instruction to the host controller MC.

The host controller MC receives the host transport instruction completion report from the transport controller TC to thereby grasp that the host transport instruction which was transmitted to the transport controller TC by the host controller MC itself has been completed. In the transport system SYS, a host transport instruction of the host controller MC is executed through the operations of Step S1 to Step S15.

Figure 7:
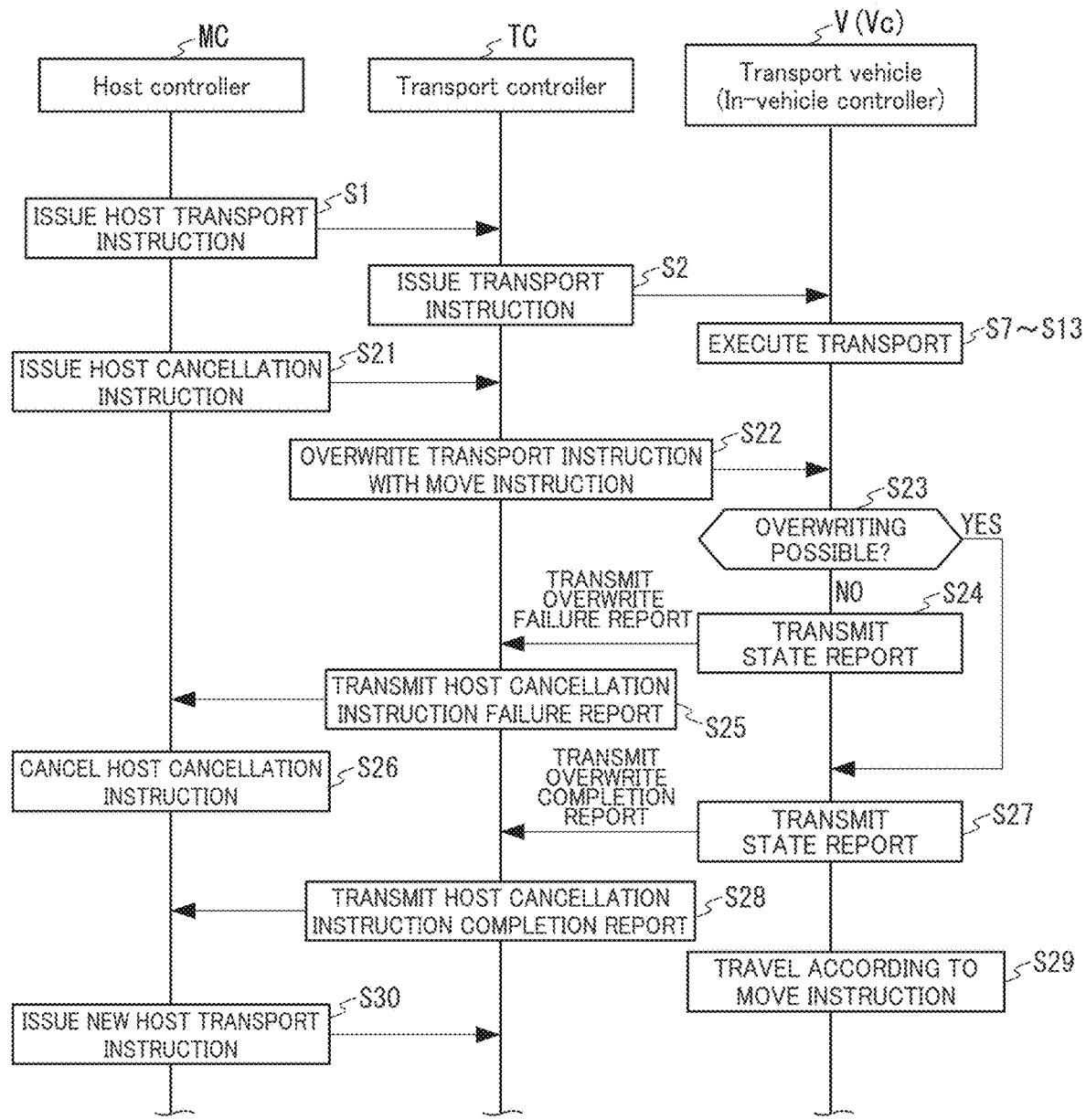
FIG. 7 is a flowchart showing an example of an operation of the transport system.
Figure 8:
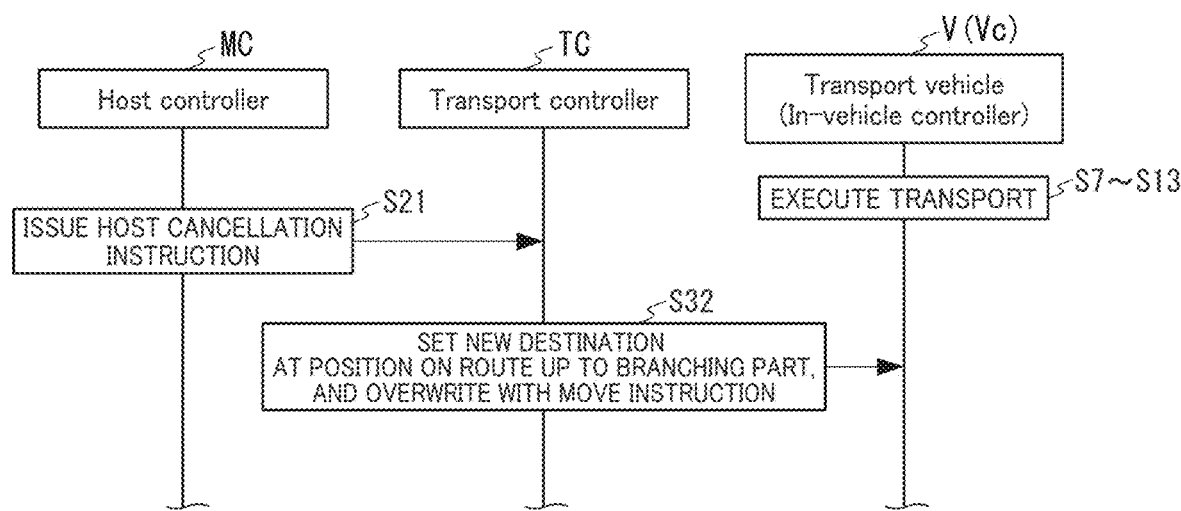
FIG. 8 is a flowchart showing an example of an operation of the transport system.
Figure 9:
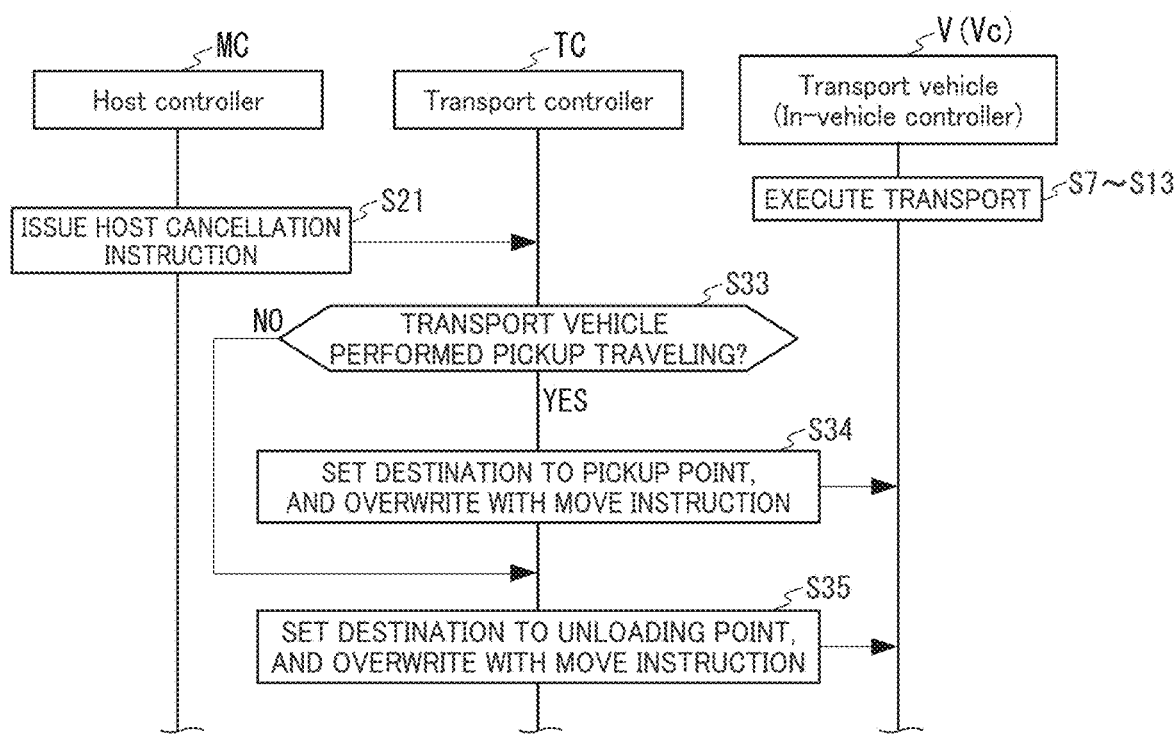
FIG. 9 is a flowchart showing an example of an operation of the transport system.

FIG. 7 to FIG. 9 are diagrams showing an example of the operation flow of the transport system SYS. Here is described an example of an operation to execute cancellation of a host transport instruction based on a host cancellation instruction of the host controller MC of the transport system SYS. In the description of this operation flow, reference will be provided to FIG. 1 to FIG. 6D where appropriate. In descriptions similar to those described above, the same reference signs are provided and the descriptions thereof are omitted or simplified where appropriate.

In the example of FIG. 7, in Step S1, the host controller MC transmits a host transport instruction to the transport controller TC. In Step S2, the transport controller TC assigns a transport instruction to a transport vehicle V. The transport vehicle V executes the assigned transport instruction of Step S7 to Step S13.

As described above, in some cases, the host controller MC may cancel a host transport instruction the execution of which has already been determined. In Step S21, the host cancellation instruction determiner 32 of the host controller MC determines execution of a host cancellation instruction and transmits the host cancellation instruction to the transport controller TC.

The host cancellation instruction receiver 46 of the transport controller TC receives the host cancellation instruction from the host controller MC. Upon receiving the host cancellation instruction, the host cancellation instruction receiver 46 transmits information related to the host cancellation instruction to the overwriting processor 47.

Upon receiving the host cancellation instruction, in Step S22, the overwriting processor 47 overwrites the transport instruction with a move instruction and assigns it to the transport vehicle V. That is, a move instruction having a predetermined position as a destination is assigned to the transport vehicle V to which the transport instruction corresponding to the target host transport instruction of the host cancellation instruction is assigned. In Step S22, as described above, the overwriting processor 47 sets the predetermined position to any position from the current position of the target transport vehicle V of overwriting with a move instruction, to the branching portion 10 on the route TA in the traveling direction. Alternatively, the overwriting processor 47 sets the predetermined position to any position from the current position of the target transport vehicle V of overwriting with a move instruction, to the pickup point or the unloading point of the transport instruction assigned to the transport vehicle V.

In Step S23 of FIG. 7, when the in-vehicle controller VC of the transport vehicle V receives the move instruction from the transport controller TC, the in-vehicle controller VC determines whether or not the received move instruction is able to overwrite the transport instruction. The in-vehicle controller VC determines that overwriting with the move instruction is able to be performed if it determines the received move instruction as being executable based on its own state information.

If the in-vehicle controller VC of the transport vehicle V determines overwriting with the received move instruction as being impossible (Step S23; NO), in Step S24, the in-vehicle controller VC reports information regarding a failure of overwriting with the move instruction as state information to the transport controller TC (a overwriting failure report).

When the state information receiver 42 of the transport controller TC receives the status information including the information which indicates failure of overwriting of the move instruction from the transport vehicle V, in Step S25, the transport controller TC transmits to the host controller MC a host cancellation instruction failure report which indicates failure of execution of the received host cancellation instruction.

When the host controller MC receives the host cancellation instruction failure report, the host controller MC cancels the host cancellation instruction in Step S26.

When execution of the host cancellation instruction fails, the transport vehicle V executes Step S7 to Step S13 in FIG. 4 and executes the transport instruction based on the host transport instruction before overwriting. Then, in Step S14, the transport vehicle V transmits a transport instruction completion report to the transport controller TC, and in Step S15, the transport controller TC transmits a completion report of the host transport instruction to the host controller MC.

If the in-vehicle controller VC of the transport vehicle V determines overwriting with the received move instruction as being possible (Step S23; YES), in Step S27, the in-vehicle controller VC reports information regarding completion of overwriting with the move instruction as state information to the transport controller TC (an overwriting completion report). As the transport instruction is overwritten with the move instruction, a state where no transport instruction is assigned to the transport vehicle V may be provided.

In Step S29, the transport vehicle V, for which the transport instruction has been overwritten with the move instruction, travels to the destination of the move instruction according to the move instruction. As described above, in the transport system SYS (the transport controller TC) of the present preferred embodiment, a move instruction overwrites a transport instruction assigned to a transport vehicle V and is then assigned to the transport vehicle V when canceling a host transport instruction, and therefore, the traveling state of the transport vehicle V is able to be maintained without stopping the transport vehicle V.

When the state information receiver 42 of the transport controller TC receives the status information including the information which indicates completion of overwriting of the move instruction from the transport vehicle V, in Step S28, the completion reporter 49 of the transport controller TC transmits to the host controller MC a host cancellation instruction completion report which indicates completion of execution of the received host cancellation instruction. That is, in the transport system SYS (the transport controller TC) of the present preferred embodiment, when the host controller MC receives a host cancellation instruction, a delete instruction is not transmitted to the transport vehicle V to which the transport instruction corresponding to the host cancellation instruction is assigned, and, instead, a move instruction is assigned to the transport vehicle (overwritten with a move instruction). As the move instruction has overwritten normally in the transport vehicle V, the transport instruction which was assigned to the transport vehicle V is treated as having been deleted, and the transport controller TC transmits to the host controller MC a host cancellation instruction completion report regarding the transport instruction (the host transport instruction).

The host controller MC receives the host cancellation instruction completion report from the completion reporter 49 to thereby acquire information regarding completion of the host cancellation instruction which was transmitted to the transport controller TC by the host controller MC itself.

In the host controller MC, on condition that a host cancellation instruction completion report has been received, transmission of a new host transport instruction related to the article W of the canceled host transport instruction to the transport controller TC is permitted, and in Step S30, the host controller MC transmits the new host transport instruction related to the article W of the canceled host transport instruction to the transport controller TC. For example, a host transport instruction which relates to the article and differs from the canceled host transport instruction in the pickup point or the unloading point is transmitted to the transport controller TC.

The transport controller TC may implement another operation flow when overwriting the transport instruction with the move instruction and assigning it to the transport vehicle V in Step S22.

For example, as shown in FIG. 8, the overwriting processor 47 of the transport controller TC which has received the host cancellation instruction in Step S21 may set, as a predetermined position, any position from the current position of the transport vehicle V, for which the transport instruction has been overwritten, to the branching portion 10 on the route TA in the traveling direction, and may assign the transport vehicle V with a move instruction which instructs to travel to the predetermined position as described above, in Step S32. In this implementation, as described above, the newly assigned transport instruction is able to be easily executed.

For example, as described above, in Step S33 to Step SS5 of FIG. 9, the overwriting processor 47 of the transport controller TC which has received the host cancellation instruction of Step S21 may, in the case where the transport vehicle V is traveling toward a pickup point, set a position corresponding to the pickup point in the overwritten transport instruction as a predetermined position, and in the case where the transport vehicle V is traveling toward an unloading point, the overwriting processor 47 may set a position corresponding as the unloading point as the predetermined position. In this implementation, in Step S33, the overwriting processor 47 determines in step S33 whether or not the target transport vehicle V of the overwriting processing has not performed pickup traveling. If the overwriting processor 47 determines that the target transport vehicle V has not yet performed pickup traveling (YES in Step S33), in Step S34, the overwriting processor 47 sets a position corresponding to the pickup point in the overwritten transport instruction as a predetermined position, and assigns the transport vehicle V with a move instruction which instructs to travel to the predetermined position. If the overwriting processor 47 determines that the target transport vehicle V has performed pickup traveling (NO in Step S33), in Step S35, the overwriting processor 47 sets a position corresponding to the unloading point in the overwritten transport instruction as a predetermined position, and assigns the transport vehicle V with a move instruction which instructs to travel to the predetermined position. In this implementation, as described above, the new destination of the transport vehicle V, which has been overwritten with the move instruction by the overwriting processor 47, is the same as the destination of the transport instruction before overwritten, and therefore, the transport vehicle V is already traveling on the route. Accordingly, the transport vehicle V is able to travel on the new route. As a result, the overwriting process for the transport vehicle V is able to be executed more reliably.

Figure 10:
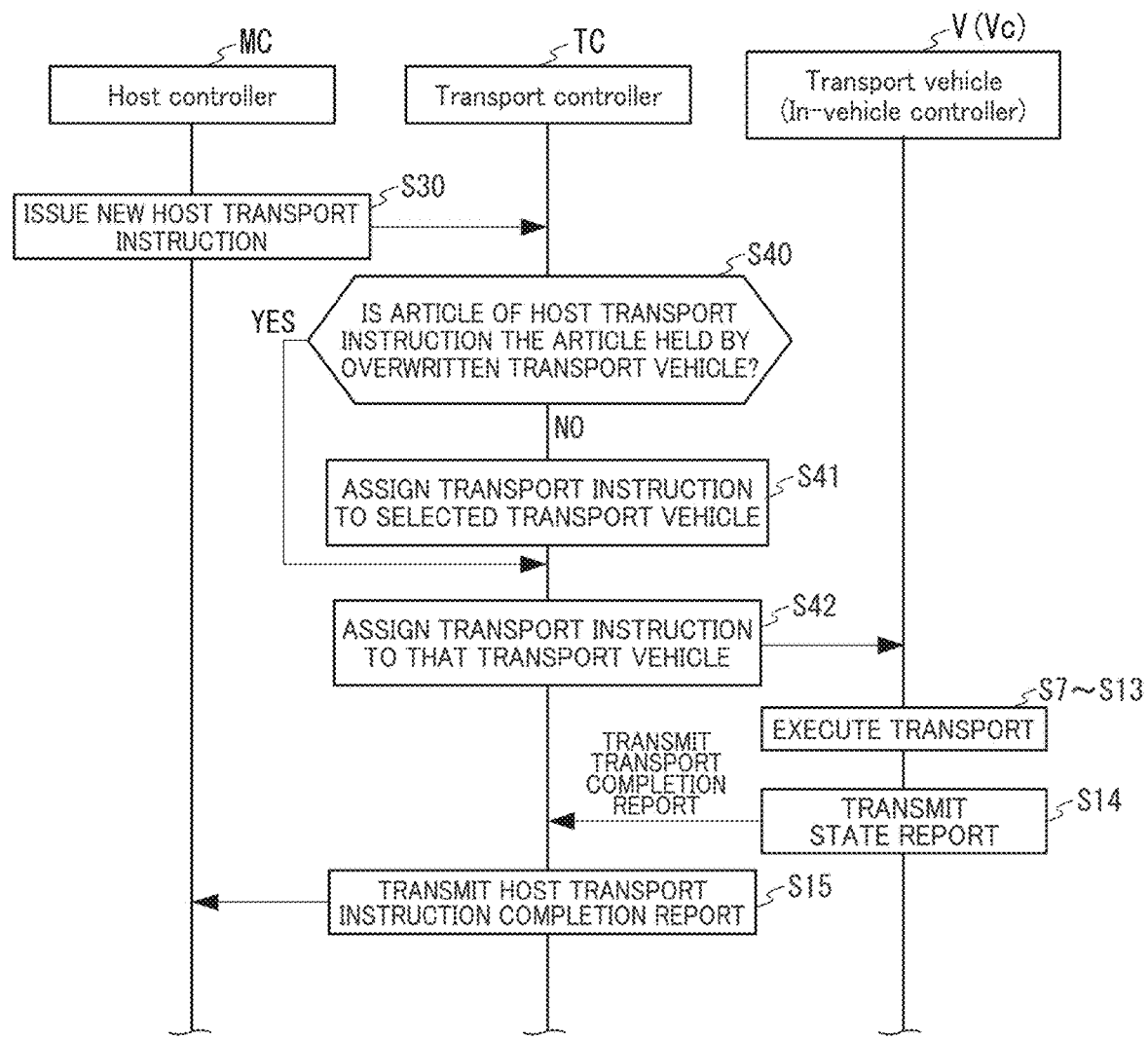
FIG. 10 is a flowchart showing an example of an operation of the transport system.
Figure 11:
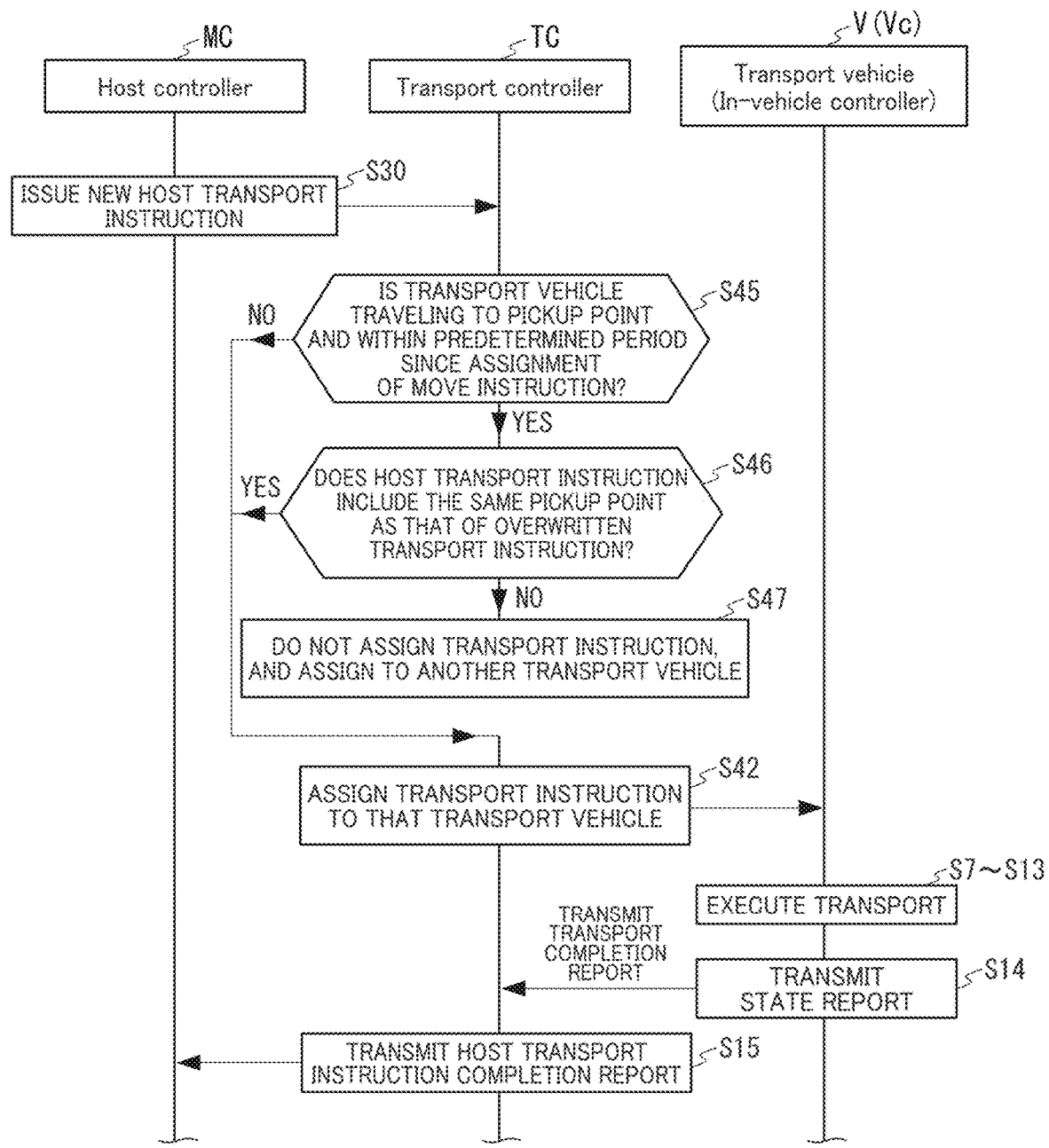
FIG. 11 is a flowchart showing an example of an operation of the transport system.

FIG. 10 and FIG. 11 are diagrams showing an example of an operation flow of the transport system SYS. Here is described an example of an operation in which after the host controller MC in the transport system SYS has completed a host cancellation instruction, a new host transport instruction is performed in relation to the article W for which the host controller MC executed a host cancellation instruction. In the description of this operation flow, reference will be provided to FIG. 1 to FIG. 8 where appropriate. In descriptions similar to the above descriptions, the same reference signs are provided and the descriptions thereof are omitted or simplified where appropriate.

As shown in FIG. 10, the host controller MC receives a host cancellation instruction completion report, and in Step S30, transmits to the transport controller TC a new host transport instruction related to the article W of the canceled host transport instruction.

The host transport instruction receiver 43 of the transport controller TC receives the host transport instruction, and transmits information related to the host transport instruction to the transport instructor 44. The transport instructor 44 assigns the transport vehicle V overwritten with a move instruction by the overwriting processor 47, with a transport instruction in accordance with the host transport instruction which is newly issued in relation to the article W held by the transport vehicle V, after the host controller MC has received the host cancellation instruction completion report. For example, in Step S40, the transport instructor 44 determines whether or not the article W related to the host transport instruction is the article W held by the transport vehicle V which has executed the overwriting processing (the host cancellation instruction).

If the transport instructor 44 determines the article W related to the host transport instruction as not being the article W held by the transport vehicle V which has executed the overwriting processing (NO in Step S40), as with the Step S2 of FIG. 4, the transport instructor 44 determines a transport vehicle V to perform the host transport instruction, and assigns a transport instruction based on the host transport instruction to the determined transport vehicle V.

If the transport instructor 44 determines the article W related to the host transport instruction as being the article W held by the transport vehicle V which has executed the overwriting processing (YES in Step S40), in Step S42, the transport instructor 44 assigns a transport instruction based on the host transport instruction to the transport vehicle V which executed the overwriting processing. In this implementation, the host transport instruction newly issued in relation to the article W held by a transport vehicle V is assigned to that transport vehicle V, and as a result, a reduction in the efficiency of transporting the article W is able to be significantly reduced or prevented. The transport vehicle V with the transport instruction assigned to the transport vehicle executes the transport instruction of Step S7 to Step S13 as in FIG. 4, and, in Step S14, transmits a transport completion report as a status report to the transport controller TC. In Step S15 as in FIG. 4, the completion reporter 49 of the transport controller TC transmits a host transport instruction completion report to the host controller MC.

In Step S40, the transport controller TC may implement the operation flow shown in FIG. 11 when assigning the transport instruction based on the host transport instruction to the transport vehicle V. In the example shown in FIG. 11, when the overwriting processor 47 overwrites the transport instruction and assigns the move instruction, if the transport vehicle is traveling toward a pickup point, the transport instructor 44 may assign the transport vehicle V only with a transport instruction including the same pickup point as that in the overwritten transport instruction, for a predetermined period of time after the move instruction is assigned.

For example, in Step S45 shown in FIG. 11, the transport instructor 44 determines whether or not the transport vehicle V to which the transport instruction is assigned is traveling toward the pickup point and a predetermined length of period (time) has elapsed since the move instruction was assigned.

If the transport instructor 44 determines that the transport vehicle V to which the transport instruction is assigned is traveling toward the pickup point and the predetermined length of period (time) has not elapsed since the move instruction was assigned (still in the predetermined period) (YES in Step S45), in step S46, the transport instructor 44 determines whether or not the host transport instruction includes the same pickup point as that of the overwritten transport instruction.

If the transport instructor 44 determines that the host transport instruction includes the same pickup point as that of the overwritten transport instruction (NO in Step S46), in Step S47, the transport instructor 44 does not assign the transport instruction based on the host transport instruction to the transport vehicle V which executed the overwriting processing, and assigns it to another transport vehicle V.

If the transport instructor 44 determines that the transport vehicle V to which the transport instruction based on the host transport instruction is assigned is traveling toward the pickup point and the predetermined length of period (time) has elapsed since the move instruction was assigned (NO in Step S45), and if the transport instructor 44 determines that the host transport instruction includes the same pickup point as that of the overwritten transport instruction (YES in Step S46), as with Step S42 of FIG. 10, the transport instructor 44 assigns the transport instruction based on the host transport instruction to the transport vehicle V which executed the overwriting processing. In this implementation, as described above, since the transport vehicle V with the transport instruction having been canceled therefor is traveling toward an pickup point, the transport vehicle V is able to be instructed to pick up an article W at the pickup point early by assigning a new transport instruction to the transport vehicle V, and a reduction in the efficiency of transporting the article is able to be significantly reduced or prevented. The transport vehicle V with the transport instruction assigned to the transport vehicle executes the transport instruction of Step S7 to Step S13 as in FIG. 4, and, in Step S14, transmits a transport completion report as a status report to the transport controller TC. In Step S15 as in FIG.

4, the completion reporter 49 of the transport controller TC transmits a host transport instruction completion report to the host controller MC. In the transport system SYS, after the host controller MC has completed the host cancellation instruction of the host controller MC through the operations shown in FIG. 9 to FIG. 11, the new host transport instruction is executed in relation to the article W for which the host controller MC executed the host cancellation instruction.

As described above, the transport system SYS (the transport controller TC) of the present preferred embodiment includes: the overwriting processor 47 which, in accordance with a host cancellation instruction to cancel the host transport instruction received from the host controller MC, overwrites the transport instruction assigned to a transport vehicle V with a move instruction which instructs to travel to a predetermined position and not to unload at the predetermined position, and which assigns the overwritten instruction to the transport vehicle V; and the completion reporter 49 which, upon the overwriting processor 47 completing the overwriting, transmits to the host controller MC a cancellation completion report regarding the completion of the host cancellation instruction. The transport vehicle control method of the present preferred embodiment is a method to control a transport vehicle V which travels along a predetermined route TA and transports an article W, the method comprising: assigning, in accordance with a host transport instruction related to transport of the article W and received from the host controller MC, the transport vehicle V with a transport instruction to transport the article W at a pickup point to an unloading point; overwriting, in accordance with a host cancellation instruction to cancel the host transport instruction received from the host controller MC, the transport instruction assigned to the transport vehicle V with a move instruction which instructs to travel to a predetermined position and not to unload at the predetermined position, and which assigning the overwritten instruction to the transport vehicle; and transmitting, upon completion of the overwriting with the move instruction, to the host controller MC a cancellation completion report regarding the completion of the host cancellation instruction. In each of the transport system SYS (the transport controller TC) and the transport vehicle control method of the present preferred embodiment, features, components, and/or elements other than those described above are arbitrary features, components, and/or elements, and features, components, and/or elements other than those described above may or may not be necessary. The control method of the present preferred embodiment may be provided by a program which controls a computer device to execute the above control method, or by a storage medium which stores (records) the program.

In the transport system SYS (the transport controller TC) and the transport vehicle control method of the present preferred embodiment, when the host controller MC cancels execution of the host transport instruction and transmits a new host transport instruction related to the article W of the canceled host transport instruction to the transport controller TC, the host controller MC transmits the new host transport instruction related to the article of the canceled host transport instruction to the transport controller TC after the completion report which indicates the completion of execution cancellation of the host transport instruction has been received from the transport controller TC, and thus complies with the SEMI standard. According to the transport system SYS (the transport controller TC) and the transport vehicle control method of the present preferred embodiment, the overwriting processor 47 of the transport controller TC overwrites, in accordance with a host cancellation instruction, a transport instruction assigned to a transport vehicle V with a move instruction which instructs to travel to a predetermined position and not to perform unloading at the predetermined position, and the completion reporter 49 transmits a cancellation completion report to the host controller MC. As a result, the cancellation completion report is able to be transmitted to the host controller MC early and reliably without stopping the transport vehicle V. The host controller MC is able to, upon receiving a cancellation completion report, transmit a new host transport instruction to the transport controller TC, and the transport controller TC assigns a new transport instruction to a traveling transport vehicle V based on this host transport instruction. As a result, a reduction associated with cancellation of the host transport instruction in the efficiency of article W transport is able to be significantly reduced or prevented. The transport system SYS (the transport controller TC) and the transport vehicle control method of the present preferred embodiment is able to be implemented by only changing the transport controller without changing the host controller in an existing transport system, and is able to therefore be easily introduced at low cost.

As described above, according to the transport systems, the transport controllers, and the transport vehicle control methods of the present preferred embodiments of the present invention, when a host cancellation instruction is received from the host controller, the transport controller TC overwrites a transport instruction assigned to a transport vehicle V with a move instruction which instructs to travel to a predetermined location and not to perform unloading at the predetermined location, rather than deleting the transport instruction, and by transmitting, upon completion of the overwriting, to the host controller a host cancellation instruction completion report, a new transport instruction transmitted from the host controller in accordance with the completion report is able to be re-assigned to a transport vehicle V, without stopping the transport vehicle V with a transport instruction having been assigned to the transport vehicle.

The preferred embodiments of the present invention have been described above. However, the technical scope of the present invention is not limited to the above description of the preferred embodiments. It is also apparent to those skilled in the art that various modifications or improvements may be incorporated to the preferred embodiments described above. The technical scope of the present invention also encompasses one or more of such modifications or improvements. One or more of the features, components, and/or elements described in the preferred embodiments described above may be omitted in some cases. One or more of the features, components, and/or elements described in the preferred embodiments described above may be appropriately combined. The contents of Japanese Patent Application No. 2018-059595 and all documents cited in the detailed description of the present invention are incorporated herein by reference to the extent permitted by law. The order of executing processes shown in the present preferred embodiments is able to be realized in an arbitrary order unless an output of the previous processing is used in the following processing. While operations in the preferred embodiments described above have been described with expressions, for example, "first", "next", and "subsequently," for the sake of convenience, the operations need not always be implemented in that order.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport system comprising:
    a transport vehicle that travels along a predetermined route and transports an article; and
    a transport controller to control the transport vehicle based on a host transport instruction related to article transport and received from a host controller; wherein
    the transport controller is configured or programmed to include:
    a transport instructor to provide, in accordance with the host transport instruction received from the host controller, the transport vehicle with a transport instruction to transport the article at a pickup point to an unloading point;
    an overwriting processor to overwrite, in accordance with a host cancellation instruction to cancel the host transport instruction received from the host controller, the transport instruction provided to the transport vehicle with a move instruction which instructs to travel to a predetermined position and not to unload at the predetermined position, and to provide an overwritten instruction to the transport vehicle; and
    a completion reporter to transmit, upon the overwriting processor completing the overwriting, to the host controller a cancellation completion report indicating completion of the host cancellation instruction.

2. The transport system according to claim 1, wherein the transport instructor provides the transport vehicle for which the overwriting processor has overwritten the move instruction with the transport instruction in accordance with the host transport instruction which is newly issued in relation to the article held by the transport vehicle after the host controller has received the cancellation completion report.

3. The transport system according to claim 1, wherein the overwriting processor sets, as the predetermined position, any position from the current position of the transport vehicle, the instruction for which has been overwritten with the move instruction, to a branching portion on the route in a traveling direction.

4. The transport system according to claim 1, wherein the overwriting processor sets, when a transport vehicle with the transport instruction provided to the transport vehicle is traveling toward the pickup point, any position from the current position of the transport vehicle to the pickup point as the predetermined position, and sets, when the transport vehicle is traveling toward the unloading point, any position from the current position of the transport vehicle to the unloading point as the predetermined position.

5. The transport system according claim 1, wherein when the overwriting processor overwrites the transport instruction and provides the move instruction, if the transport vehicle is traveling toward the pickup point, the transport instructor provides the transport vehicle only with the transport instruction designated for the same pickup point as that in the transport instruction, for a predetermined period of time after the move instruction is provided.

6. A transport controller to control a transport vehicle that travels along a predetermined route and transports an article based on a host transport instruction related to article transport and received from a host controller, the transport controller comprising:
    a transport instructor to provide, in accordance with the host transport instruction received from the host controller, the transport vehicle with a transport instruction to transport the article at a pickup point to an unloading point;
    an overwriting processor to overwrite, in accordance with a host cancellation instruction to cancel the host transport instruction received from the host controller, the transport instruction provided to the transport vehicle with a move instruction that instructs to travel to a predetermined position and not to unload at the predetermined position, and to provide the overwritten instruction to the transport vehicle; and
    a completion reporter to transmit, upon the overwriting processor completing the overwriting, to the host controller a cancellation completion report indicating the completion of the host cancellation instruction.

7. A transport vehicle control method to control a transport vehicle which travels along a predetermined route and transports an article, the method comprising:
    providing, in accordance with a host transport instruction related to article transport and received from a host controller, the transport vehicle with a transport instruction to transport the article at a pickup point to an unloading point;
    overwriting, in accordance with a host cancellation instruction to cancel the host transport instruction received from the host controller, the transport instruction provided to the transport vehicle with a move instruction which instructs to travel to a predetermined position and not to unload at the predetermined position, and providing the overwritten instruction to the transport vehicle; and
    transmitting, upon completion of the overwriting with the move instruction, to the host controller a cancellation completion report signaling the completion of the host cancellation instruction.

* * * * *